US012690258B2

(12) United States Patent  
Chu et al.

(10) Patent No.: US 12,690,258 B2  
(45) Date of Patent: Jul. 21, 2026

(54) DIPOLE PATTERNING FOR CMOS DEVICES

(71) Applicant: Taiwan Semiconductor Manufacturing Co., Ltd., Hsinchu (TW)

(72) Inventors: Lung-Kun Chu, New Taipei City (TW); Mao-Lin Huang, Hsinchu City (TW); Chung-Wei Hsu, Hsinchu (TW); Jia-Ni Yu, Hsinchu (TW); Kuo-Cheng Chiang, Hsinchu County (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 998 days.

(21) Appl. No.: 17/873,787

(22) Filed: Jul. 26, 2022

(65) Prior Publication Data

US 2022/0375936 A1     Nov. 24, 2022

Related U.S. Application Data

(62) Division of application No. 16/879,613, filed on May 20, 2020, now Pat. No. 11,791,218.

(51) Int. Cl.  
*H10D 84/03*     (2025.01)  
*H10D 30/01*     (2025.01)  
(Continued)

(52) U.S. Cl.  
CPC ......... *H10D 84/038* (2025.01); *H10D 30/024* (2025.01); *H10D 30/43* (2025.01); (Continued)

(58) Field of Classification Search  
CPC .. H10D 30/024; H10D 30/62; H10D 84/0193; H10D 84/853; H10D 84/0181; H10D 30/6757; H10D 30/6735  
See application file for complete search history.

(56) References Cited

U.S. PATENT DOCUMENTS

| | | | |
|---|---|---|---|
| 8,836,016 B2 | 9/2014 | Wu et al. | |
| 8,841,701 B2 | 9/2014 | Lin et al. | |

(Continued)

OTHER PUBLICATIONS

Huang, Mao-Lin, et al., "Gate Patterning Process for Multi-Gate Devices", U.S. Appl. No. 16/858,440, filed Apr. 24, 2020. 32 pages of specification and 38 pages of drawings.

(Continued)

*Primary Examiner* — Mary A Wilczewski  
(74) *Attorney, Agent, or Firm* — HAYNES AND BOONE, LLP

(57)     ABSTRACT

A semiconductor device includes first and second n-type transistors and first and second p-type transistors. The first n-type transistor includes a first channel layer and a first portion of a high-k dielectric layer over the first channel layer. The second n-type transistor includes a second channel layer and a second portion of the high-k dielectric layer over the second channel layer, wherein the second portion includes a higher amount of an n-type dipole material than the first portion. The first p-type transistor includes a third channel layer and a third portion of the high-k dielectric layer over the third channel layer. The second p-type transistor includes a fourth channel layer and a fourth portion of the high-k dielectric layer over the fourth channel layer, wherein the fourth portion includes a higher amount of a p-type dipole material than the third portion.

20 Claims, 26 Drawing Sheets

(51) Int. Cl.

| | |
|---|---|
| *H10D 30/43* | (2025.01) |
| *H10D 30/62* | (2025.01) |
| *H10D 30/67* | (2025.01) |
| *H10D 62/10* | (2025.01) |
| *H10D 62/80* | (2025.01) |
| *H10D 84/01* | (2026.01) |
| *H10D 84/85* | (2025.01) |

(52) U.S. Cl.
CPC ......... *H10D 30/62* (2025.01); *H10D 30/6219* (2025.01); *H10D 30/6735* (2025.01); *H10D 30/6757* (2025.01); *H10D 62/121* (2025.01); *H10D 62/80* (2025.01); *H10D 84/0193* (2025.01); *H10D 84/853* (2025.01)

(56) References Cited

U.S. PATENT DOCUMENTS

| | | | |
|---|---|---|---|
| 8,847,293 | B2 | 9/2014 | Lee et al. |
| 8,853,025 | B2 | 10/2014 | Zhang et al. |
| 8,962,400 | B2 | 2/2015 | Tsai et al. |
| 9,093,514 | B2 | 7/2015 | Tsai et al. |
| 9,236,267 | B2 | 1/2016 | De et al. |
| 9,245,805 | B2 | 1/2016 | Yeh et al. |
| 9,520,482 | B1 | 12/2016 | Chang et al. |
| 9,576,814 | B2 | 2/2017 | Wu et al. |
| 11,791,218 | B2 * | 10/2023 | Chu ..................... H10D 84/038 257/365 |
| 2015/0129973 | A1 * | 5/2015 | Ji ........................ H10D 84/0177 257/369 |
| 2019/0148237 | A1 * | 5/2019 | Wang ................... H10D 64/667 257/288 |
| 2021/0366783 | A1 * | 11/2021 | Chu ...................... H10D 64/01 |
| 2022/0367291 | A1 * | 11/2022 | Hsu ..................... H10D 64/514 |

OTHER PUBLICATIONS

Huang, Wang-Chun, et al., "Semiconductor Devices with Improved Capacitors", U.S. Appl. No. 16/802,396, filed Feb. 26, 2020, 30 pages of specification and 29 pages of drawings.

* cited by examiner

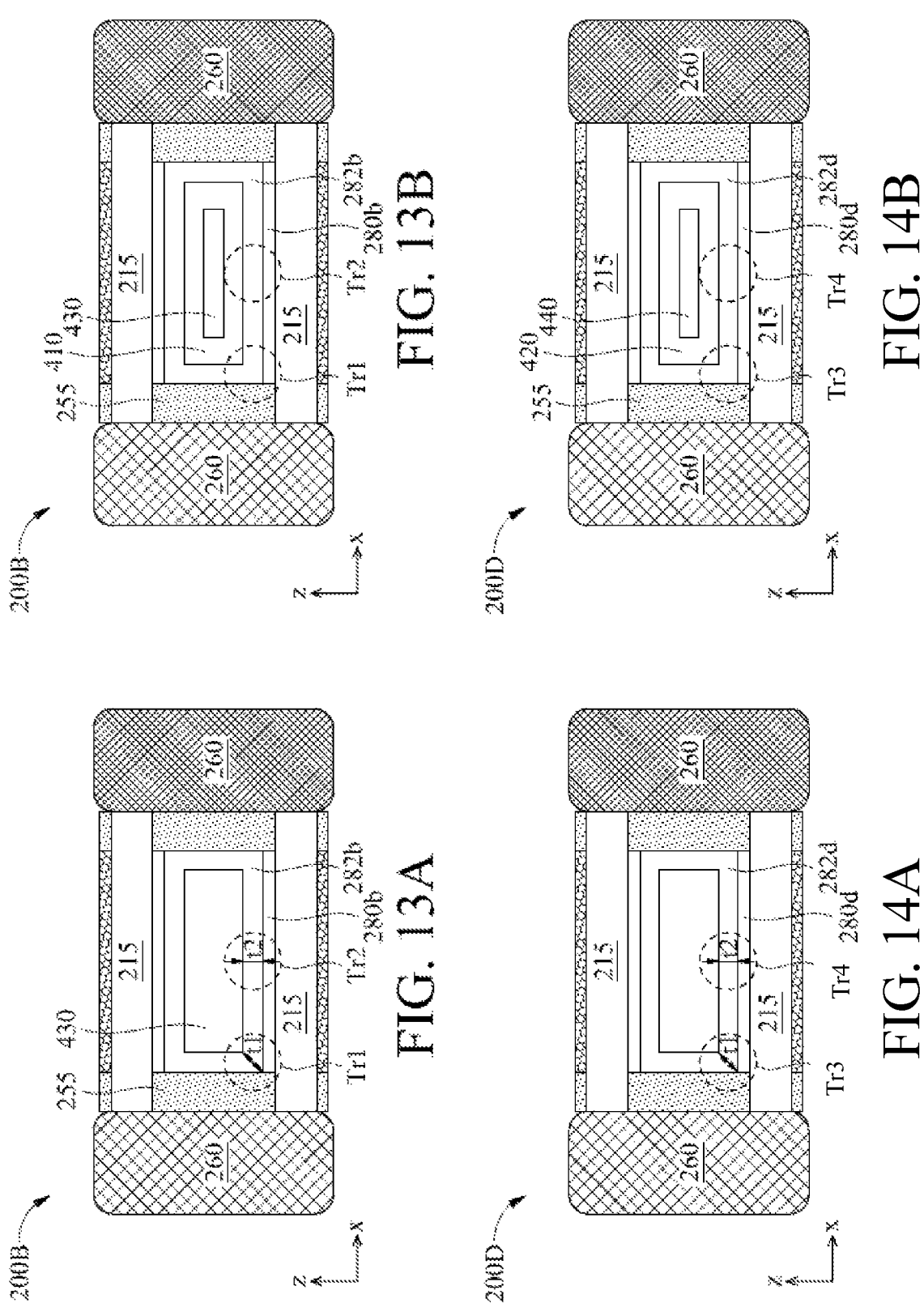

DIPOLE PATTERNING FOR CMOS DEVICES

PRIORITY DATA

This is a divisional application of U.S. application Ser. No. 16/879,613, filed May 20, 2020, which is herein incorporated by reference in its entirety.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

One area of advances is how to provide CMOS devices with multiple threshold voltages (Vt) for boosting performance for some transistors while reducing power consumption for some other transistors. Particularly, providing multiple Vt's has been challenging for multi-gate devices, such as FinFET, gate-all-around (GAA) devices including nanowire devices and nanosheet devices, and other types of multi-gate devices. One reason is that these devices are very small and there is not much room for tuning their Vt's using different work function metals alone. Accordingly, although existing CMOS devices (particularly, multi-gate devices) and methods for fabricating such devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4A, 4B, 4C, 4D, 5A, 5B, 5C, 5D, 6, 7, 8A, 8B, 9A, 9B, 10A, 10B, 11A, 11B, 12A, 12B, 12C, 12D, 12E, 13A, 13B, 14A, and 14B are diagrammatic cross-sectional views of the CMOS device in FIG. 2A, in portion, at various fabrication stages (such as those associated with the method in FIG. 1) according to various aspects of the present disclosure.

DETAILED DESCRIPTION

Figure 1:
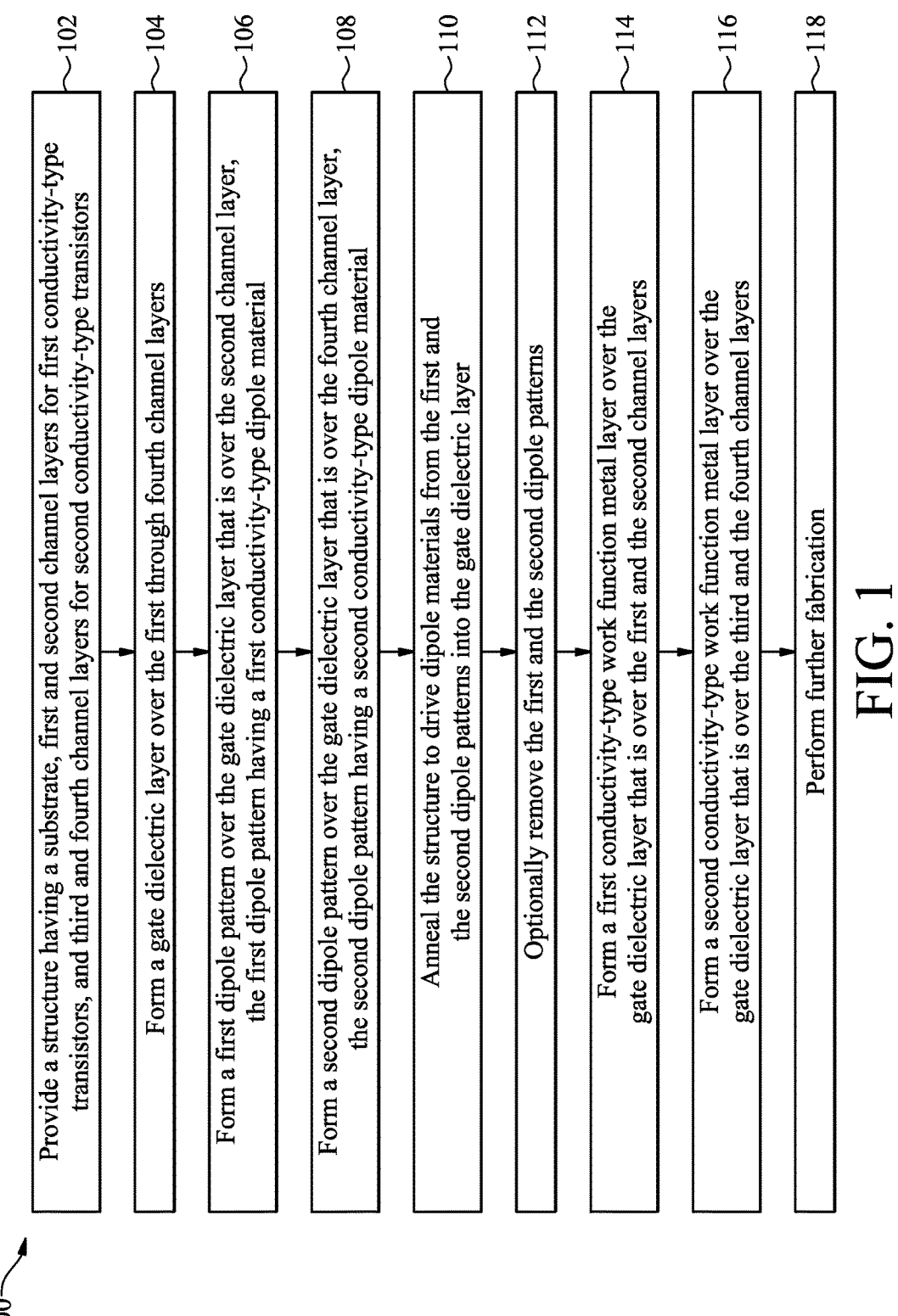
FIG. 1 is a flow chart of a method for fabricating a CMOS device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, from 4.0 nm to 5.0 nm, and so on.

The present disclosure relates generally to integrated circuit (IC) devices, and more particularly, to IC devices having both n-type MOSFETs (metal-oxide-semiconductor field effect transistors) and p-type MOSFETs. In other words, the IC devices are CMOS (complementary metal-oxide-semiconductor) devices. In some respects, the present disclosure relates to tuning the threshold voltages (Vt) of CMOS devices to provide multiple Vt's for n-type MOSFET (or NMOSFET) devices and multiple Vt's for p-type MOSFET (or PMOSFET) devices by incorporating different types of dipole materials into the gate dielectric layers of the respective devices. For example, embodiments of the present disclosure incorporate an n-type dipole material into a gate dielectric layer of an NMOSFET to further reduce its threshold voltage and incorporate a p-type dipole material into a gate dielectric layer of a PMOSFET to further reduce its threshold voltage. Advantageously, both NMOSFETs and PMOSFETs can provide standard threshold voltage and reduced threshold voltage by incorporation of the dipole materials. The threshold voltages can be further tuned by utilizing different work function metals. Thus, the present disclosure can be used to flexibly tune the threshold voltages for CMOS devices. Further, incorporating dipole materials into gate dielectric layers generally does not increase the dimension of the CMOS devices. The present disclosure can be applied to multi-gate CMOS devices, such as FinFET and gate-all-around (GAA) CMOS devices, as well as planar CMOS devices.

FIG. 1 is a flow chart of a method 100 for fabricating a CMOS device according to various aspects of the present disclosure. In some embodiments, the method 100 fabricates a multi-gate device that includes p-type GAA transistors and n-type GAA transistors. The method 100 is briefly described below.

At operation 102, an initial structure is provided. The initial structure includes four device regions for making at least four transistors. The first device region includes first channel semiconductor layers (or first channel layers) suspended between a first pair of source/drain (S/D) features of a first conductivity-type. The second device region includes second channel semiconductor layers (or second channel layers) suspended between a second pair of source/drain (S/D) features of the first conductivity-type. The third device region includes third channel semiconductor layers (or third channel layers) suspended between a third pair of source/drain (S/D) features of a second conductivity-type. The fourth device region includes fourth channel semiconductor layers (or fourth channel layers) suspended between a fourth pair of source/drain (S/D) features of the second conductivity-type. In an embodiment, the first conductivity-type is n-type and the second conductivity-type is p-type. In an alternative embodiment, the first conductivity-type is p-type and the second conductivity-type is n-type. The first through fourth channel layers are exposed in gate trenches resulted from the removal of dummy gates. At operation 104, a gate dielectric layer is formed in the gate trenches around the first through fourth channel layers. The gate dielectric layer may include an interfacial layer and a high-k dielectric layer. The gate dielectric layer partially fills the gaps between the adjacent channel layers. At operation 106, a first dipole pattern is formed over the gate dielectric layer in the second device region. At operation 108, a second dipole pattern is formed over the gate dielectric layer that is in the fourth device region. At operation 110, the structure is annealed so that the dipole elements from the first and the second dipole patterns diffuse into the respective gate dielectric layers thereunder. As a result, the second device region provides a lower Vt than the first device region, and the fourth device region provides a lower Vt than the third device region.

At operation 112, the first and the second dipole patterns may be optionally removed. At operation 114, a first conductivity-type work function metal layer is formed in the first and the second device regions to further tune the Vt's in those devices. At operation 116, a second conductivity-type work function metal layer is formed in the third and the fourth device regions to further tune the Vt's in those devices. At operation 118, the method 100 performs further steps, such as forming a bulk metal layer and contacts. Additional processing is contemplated by the present disclosure. Additional steps can be provided before, during, and after the method 100, and some of the steps described can be moved, replaced, or eliminated for additional embodiments of the method 100. The discussion that follows illustrates various embodiments of CMOS integrated circuit devices that can be fabricated according to the method 100.

Figure 2A:
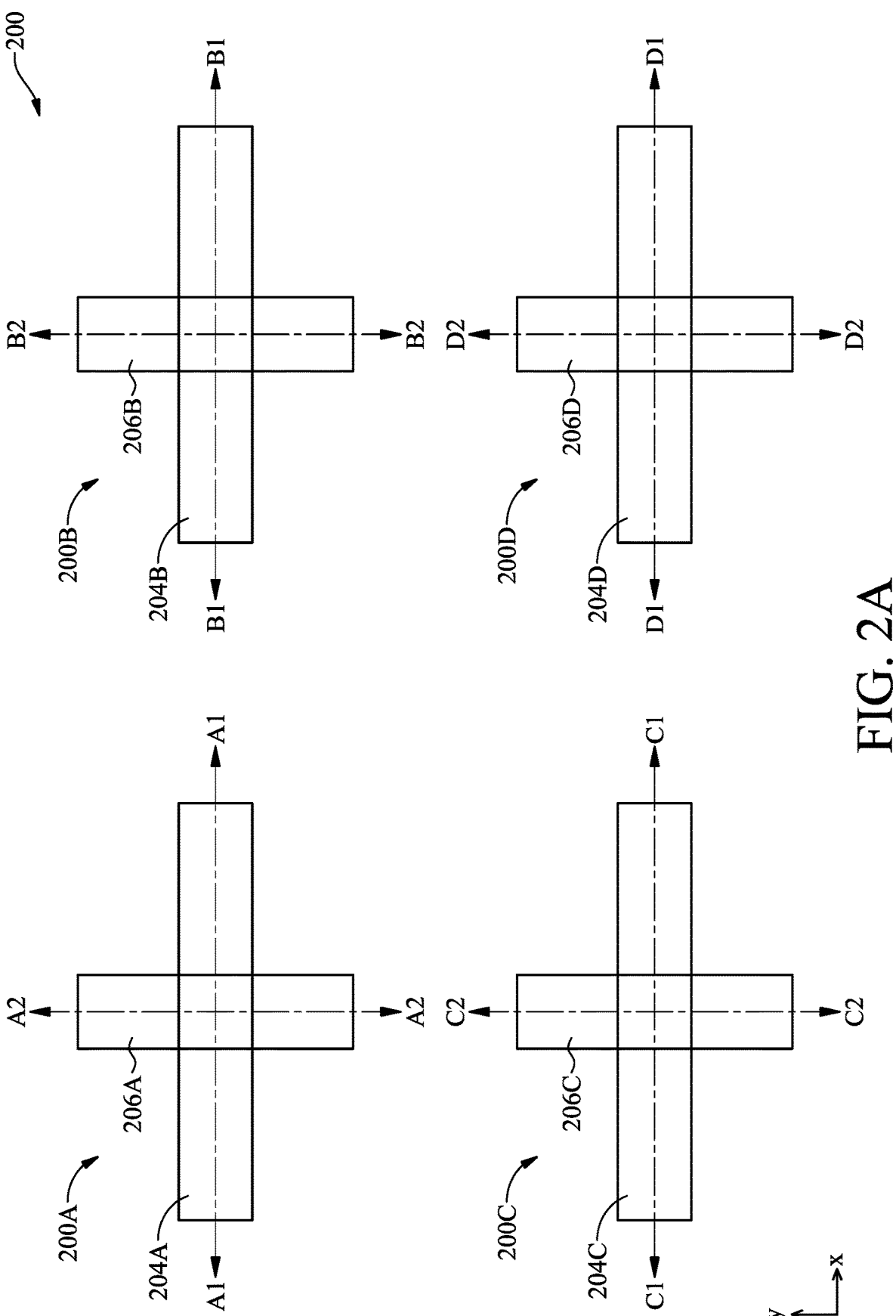
FIG. 2A is a diagrammatic top view of a CMOS device, in portion, according to various aspects of the present disclosure.

FIG. 2A is a diagrammatic top view of a CMOS device 200, in portion, at a fabrication stage associated with method 100 in FIG. 1 according to various aspects of the present disclosure. FIGS. 2B-14B are diagrammatic cross-sectional views of the device 200, in portion, at various fabrication stage associated with method 100 in FIG. 1 according to various aspects of the present disclosure.

The device 200 is a multi-gate (or multigate) device in the present embodiments, and may be included in a microprocessor, a memory, and/or other IC device. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multi-gate device 200 is included in a non-volatile memory, such as a non-volatile random access memory (NVRAM), a flash memory, an electrically erasable programmable read only memory (EEPROM), an erasable programmable read-only memory (EPROM), other suitable memory type, or combinations thereof. FIGS. 2A-14B have been simplified for the sake of clarity to better understand the inventive concepts of the present disclosure. Additional features can be added in the device 200, and some of the features described below can be replaced, modified, or eliminated in other embodiments of the device 200. The fabrication of the device 200 is described below in conjunction with embodiments of the method 100.

Figure 2C:
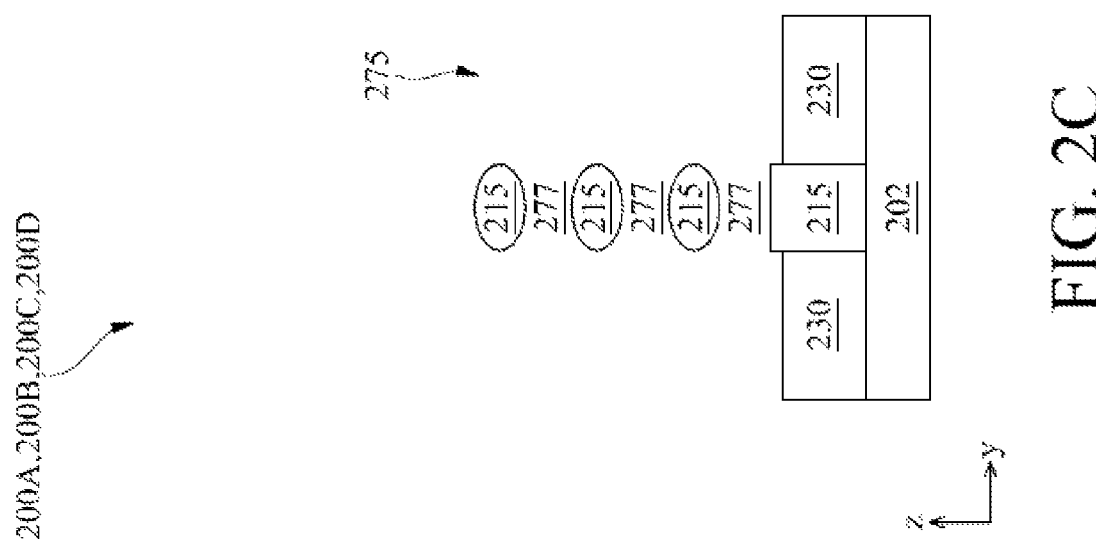
FIGS. 2B and 2C are diagrammatic cross-sectional views of the CMOS device in FIG. 2A, in portion, according to an embodiment of the present disclosure.
Figure 2B:
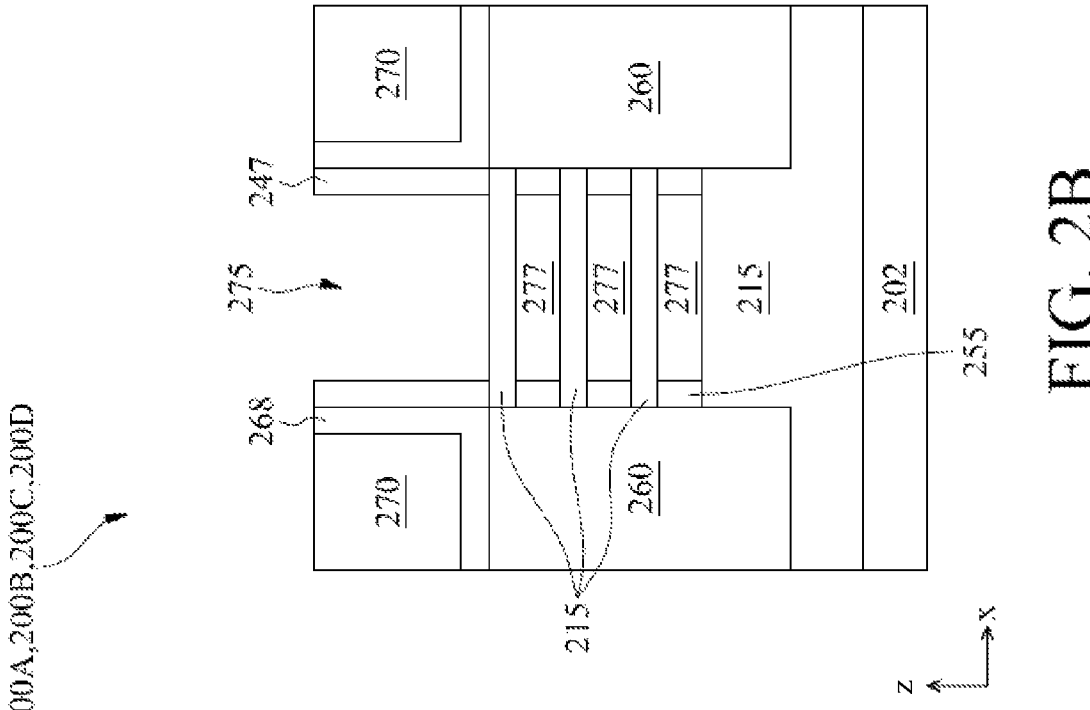

The method 100 (FIG. 1) provides an initial structure of the CMOS device 200 at the operation 102, a portion of which is shown in FIGS. 2A-2C. Particularly, FIG. 2A illustrates that the CMOS device 200 includes four transistors 200A, 200B, 200C, and 200D, where the transistors 200A and 200B are of a first conductivity-type, and the transistors 200C and 200D are of a second conductivity-type opposite to the first conductivity-type. For example, the transistors 200A and 200B are n-type transistors, and the transistors 200C and 200D are p-type transistors, or vice versa. The transistor 200A includes an active region 204A and a gate region 206A generally perpendicular to the active region 204A. The active region 204A includes a pair of source/drain regions and a channel region between the pair of source/drain regions. The gate region 206A engages the channel region. Similarly, the transistor 200B includes an active region 204B and a gate region 206B, the transistor 200C includes an active region 204C and a gate region 206C, and the transistor 200D includes an active region 204D and a gate region 206D. FIG. 2B illustrate a cross-sectional view of the device 200 according to an embodiment, which can be a cross-sectional view of the device 200A, 200B, 200C, or 200D along the A1-A1, B1-B1, C1-C1, and D1-D1 lines of FIG. 2A, respectively. FIG. 2C illustrate a cross-sectional view of the device 200 according to an embodiment, which can be a cross-sectional view of the device 200A, 200B, 200C, or 200D along the A2-A2, B2-B2, C2-C2, and D2-D2 lines of FIG. 2A, respectively. The embodiments illustrated in FIGS. 2B and 2C are nanowire FETs, where their channel layers 215 are in the shape of nanowires. The devices 200A, 200B, 200C, and 200D are illustrated as having the same configuration for the sake of clarity to better understand the inventive concepts of the present disclosure. In various embodiments, the devices 200A, 200B, 200C, and 200D can have different configurations. For example, they may have different number of channels and/or their channel layers 215 can be of different shapes or dimensions. For another example, any of the devices 200A, 200B, 200C, and 200D can be a FinFET, a nanowire FET, a nanosheet FET, or a planar FET.

Referring to FIGS. 2B-2C, the device 200 includes a substrate (e.g., a wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate.

Each of the transistors 200A-200D further includes a pair of source/drain features 260. For n-type transistors, the source/drain features 260 are of n-type. For p-type transistors, the source/drain features 260 are of p-type. The source/drain features 260 may be formed by epitaxially growing semiconductor material(s) (e.g., Si, SiGe) to fill trenches in the device 200, for example, using CVD deposition techniques (e.g., Vapor Phase Epitaxy), molecular beam epitaxy, other suitable epitaxial growth processes, or combinations thereof. The source/drain features 260 are doped with proper n-type dopants and/or p-type dopants. For example, for n-type transistors, the source/drain features 260 may include silicon and be doped with carbon, phosphorous, arsenic, other n-type dopant, or combinations thereof; and for p-type transistors, the source/drain features 260 may include silicon germanium or germanium and be doped with boron, other p-type dopant, or combinations thereof.

Each of the transistors 200A-200D further includes a stack of semiconductor layers 215 suspended over the substrate 202 and connecting the pair of the source/drain features 260. The stack of semiconductor layers 215 serve as the transistor channels for the respective transistor. Accordingly, the semiconductor layers 215 are also referred to as channel layers 215. The channel layers 215 are exposed in a gate trench 275 which is resulted from the removal of a dummy gate from the respective gate region 206A, 206B, 206C, or 206D (FIG. 2A) therein. The channel layers 215 may include single crystalline silicon. Alternatively, the channel layers 215 may comprise germanium, silicon germanium, or another suitable semiconductor material(s). Initially, the channel layers 215 are formed as part of a semiconductor layer stack that includes the channel layers 215 and other semiconductor layers of a different material. The semiconductor layer stack is patterned into a shape of a fin protruding above the substrate 202 using one or more photolithography processes, including double-patterning or multi-patterning processes. After the gate trenches 275 are formed, the semiconductor layer stack is selectively etched to remove the other semiconductor layers, leaving the channel layers 215 suspended over the substrate 202 and between the respective source/drain features 260. The channel layers 215 are separated from each other and from the substrate 202 by gaps 277.

In some embodiments, each channel layer 215 has nanometer-sized dimensions. For example, each channel layer 215 may have a length (along the "x" direction) about 10 nm to about 300 nm, and a width (along the "y" direction) about 10 nm to about 80 nm, and a height (along the "z" direction) about 4 nm to about 8 nm in some embodiments. The vertical spacing (along the "z" direction) between the channel layers 215 may be about 6 nm to about 15 nm in some embodiments. Thus, the channel layer 215 can be referred to as a "nanowire," which generally refers to a channel layer suspended in a manner that will allow a metal gate to physically contact at least two sides of the channel layer, and in GAA transistors, will allow the metal gate to physically contact at least four sides of the channel layer (i.e., surround the channel layer). In some embodiments, the channel layers 215 may be cylindrical-shaped (e.g., nanowire), rectangular-shaped (e.g., nanobar), sheet-shaped (e.g., nanosheet), etc.), or have other suitable shapes.

The device 200 further includes isolation feature(s) 230 to isolate various regions, such as the various active regions 204A, 204B, 204C, and 204D. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures, deep trench isolation (DTI) structures, and/or local oxidation of silicon (LOCOS) structures. Isolation features 230 can include multiple layers of insulating materials.

The device 200 further includes gate spacers 247 adjacent to the source/drain features 260. The gate spacers 247 may include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In some embodiments, the gate spacers 247 include a multi-layer structure, such as a first dielectric layer that includes silicon nitride and a second dielectric layer that includes silicon oxide. The device 200 further includes inner spacers 255 vertically between adjacent channel layers 215 and adjacent to the source/drain features 260. Inner spacers 255 may include a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, inner spacers 255 include a low-k dielectric material. The gate spacers 247 and the inner spacers 255 are formed by deposition (e.g., CVD, PVD, ALD, etc.) and etching processes (e.g., dry etching). The gate trenches 275 are provided between opposing gate spacers 247 and opposing inner spacers 255.

The device 200 further includes a contact etch stop layer (CESL) 268 disposed over the isolation features 230, the epitaxial source/drain features 260, and the gate spacers 247. The CESL 268 includes silicon and nitrogen, such as silicon nitride or silicon oxynitride. The CESL 268 may be formed by a deposition process, such as CVD, or other suitable methods. The device 200 further includes an inter-level dielectric (ILD) layer 270 over the CESL 268. The ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. The ILD layer 270 may be formed by a deposition process, such as CVD, flowable CVD (FCVD), or other suitable methods.

Figures 2D, 2E:
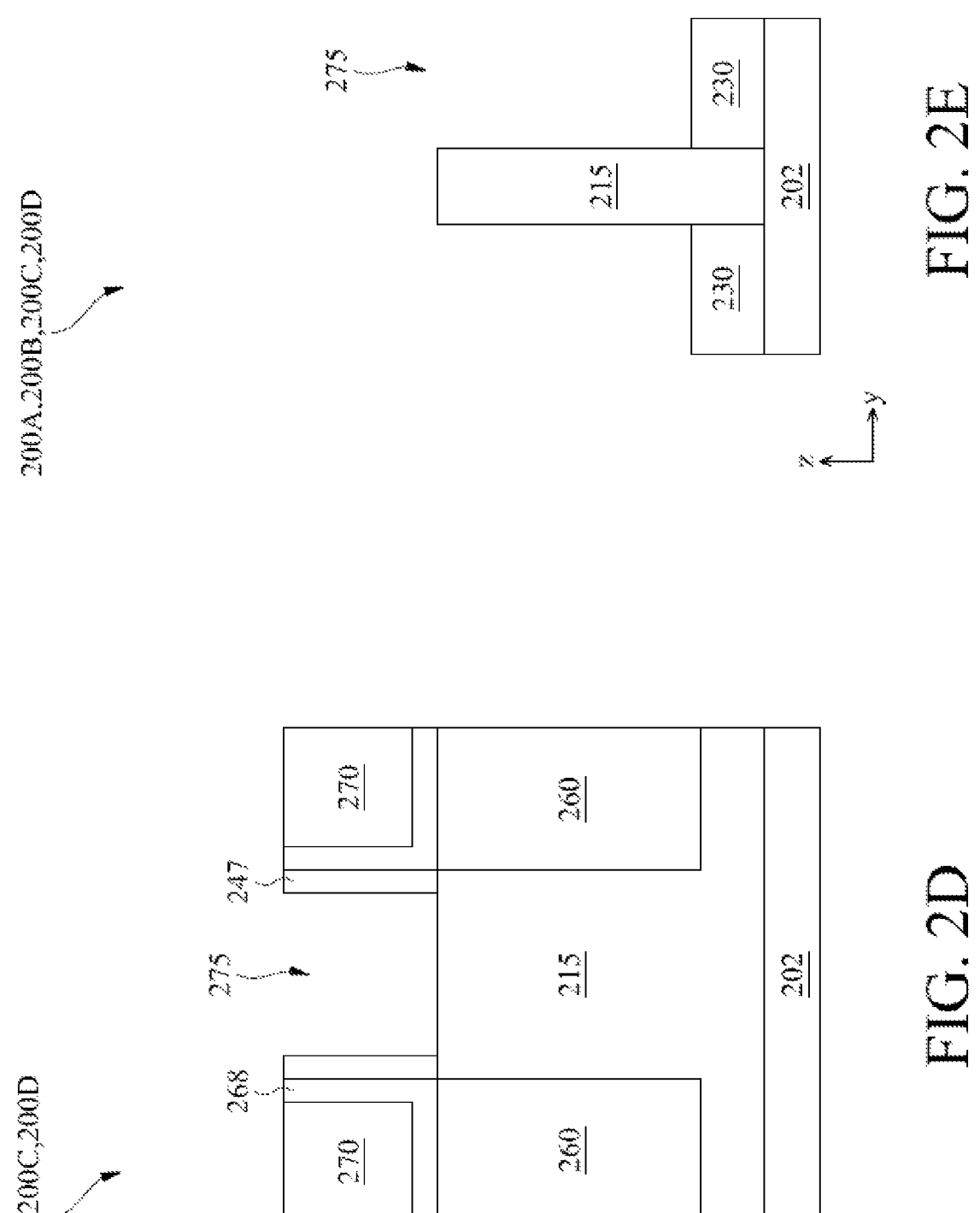
FIGS. 2D and 2E are diagrammatic cross-sectional views of the CMOS device in FIG. 2A, in portion, according to another embodiment of the present disclosure.

FIG. 2D illustrate a cross-sectional view of the device 200 according to another embodiment, which can be a cross-sectional view of the device 200A, 200B, 200C, or 200D along the A1-A1, B1-B1, C1-C1, and D1-D1 lines of FIG. 2A, respectively. FIG. 2E illustrate a cross-sectional view of the device 200 according to another embodiment, which can be a cross-sectional view of the device 200A, 200B, 200C, or 200D along the A2-A2, B2-B2, C2-C2, and D2-D2 lines of FIG. 2A, respectively. In the embodiment depicted in FIGS. 2D and 2E, the channel layer 215 is in the shape of a fin rather than multiple stacked layers. Thus, it is also referred to as a fin 215. The fin 215 extends from the substrate 202 and through the isolation feature 230. The fin 215 connects the pair of source/drain features 260. The fin 215 may have a height (along the "z" direction) about 40 nm to about 70 nm and a width (along the "y" direction) about 4 nm to about 8 nm in some embodiments. The transistors 200A, 200B, 200C, and 200D are FinFETs in this embodiment. In the following discussion, the transistors 200A, 200B, 200C, and 200D are nanowire FETs, such as illustrated in FIGS. 2B and 2C. However, they can also be FinFETs as illustrated in FIGS. 2D and 2E and the method 100 can be applied similarly to either embodiments, or to other types of transistors not illustrated in FIGS. 2B-2E.

Figure 3:
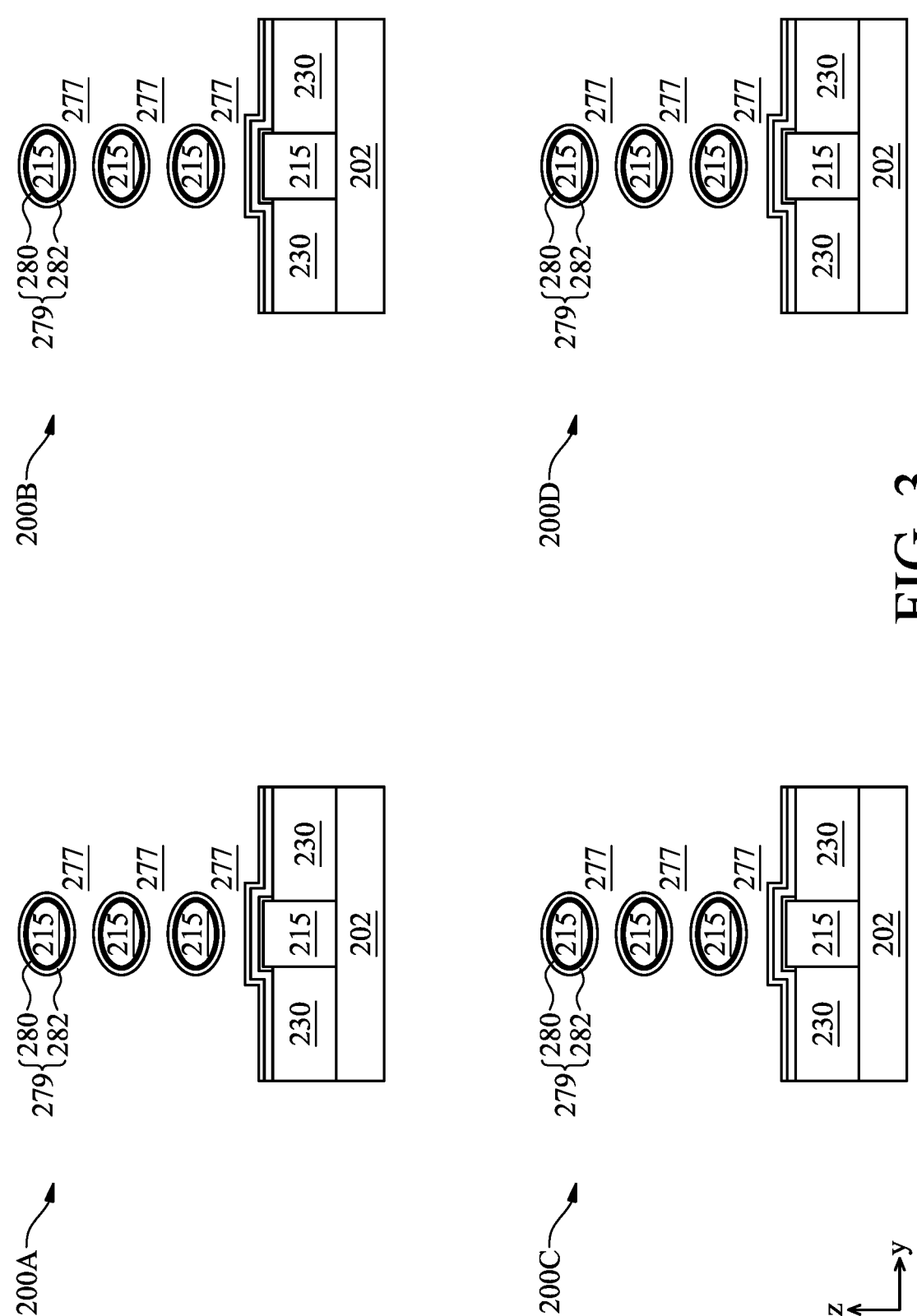

At the operation 104, the method 100 (FIG. 1) forms a gate dielectric layer 279 on the surfaces of the channel layers 215 that are exposed in the gate trenches 275, such as shown in FIG. 3, which illustrates cross-sectional views of the devices 200A, 200B, 200C, and 200D along the A2-A2, B2-B2, C2-C2, and D2-D2 lines of FIG. 2A, respectively. Turning to FIG. 3, in the depicted embodiment, the gate dielectric layer 279 includes an interfacial layer 280 over the channel layers 215 and a high-k dielectric layer 282 over the interfacial layer 280. Further, the interfacial layer 280 and the high-k dielectric layer 282 partially fill gaps 277. In some embodiments, the interfacial layer 280 and/or the high-k dielectric layer 282 are also disposed on the substrate 202, the isolation features 230, and/or the gate spacers 247. The interfacial layer 280 includes a dielectric material, such as $SiO_2$, HfSiO, SiON, other silicon-containing dielectric material, other suitable dielectric material, or combinations thereof. The high-k dielectric layer 282 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The interfacial layer 280 is formed by any of the processes described herein, such as thermal oxidation, chemical oxidation, ALD, CVD, other suitable process, or combinations thereof. In some embodiments, the interfacial layer 280 has a thickness of about 0.5 nm to about 3 nm. The high-k dielectric layer 282 is formed by any of the processes described herein, such as ALD, CVD, PVD, oxidation-based deposition process, other suitable process, or combinations thereof. In some embodiments, the high-k dielectric layer 282 has a thickness of about 1 nm to about 3 nm. In alternative embodiments, the gate dielectric layer 279 may include additional dielectric layers or may omit the interfacial layer 280.

At operation 106, the method 100 (FIG. 1) forms a dipole pattern 410 over the gate dielectric layer 279 in the transistor 200B. This may involve a variety of processes such as deposition, photolithography, and etching. An embodiment of the operation 106 is illustrated in FIGS. 4A, 4B, 4C, and 4D, which illustrate cross-sectional views of the devices 200A, 200B, 200C, and 200D along the A2-A2, B2-B2, C2-C2, and D2-D2 lines of FIG. 2A, respectively, in various steps of the operation 106.

Figure 4A:
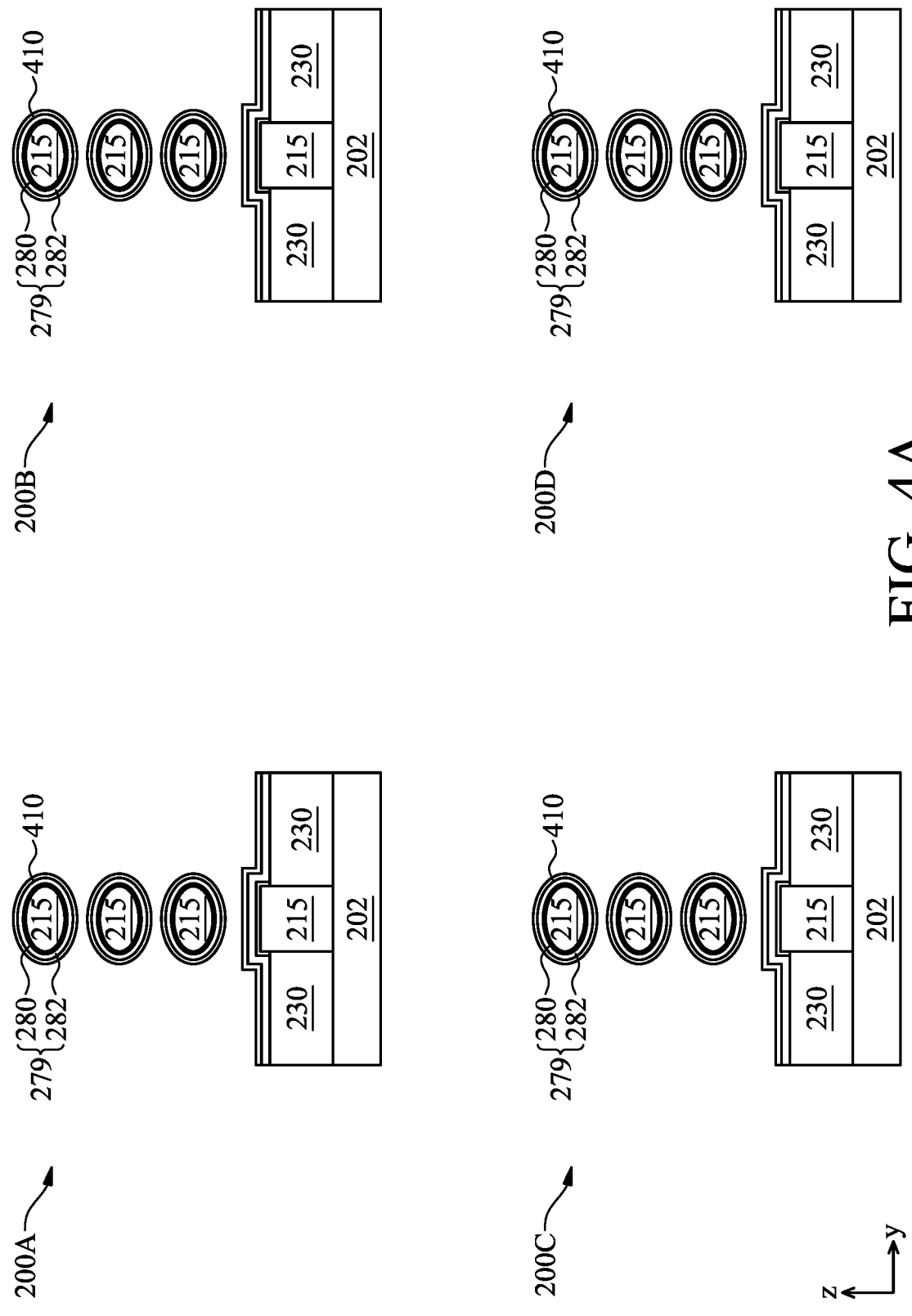

Turning to FIG. 4A, the method 100 deposits a dipole layer 410 over the gate dielectric layer 279 in the transistors 200A, 200B, 200C, and 200D. The dipole layer 410 includes a dielectric material for dipole formation in the gate dielectric layer 279 of the transistor 200B. The dielectric material can be an oxide, a nitride, or another compound, with one or more dipole elements. In some embodiments, the dipole elements can be lanthanum (La), yttrium (Y), strontium (Sr), aluminum (Al), titanium (Ti), niobium (Nb), erbium (Er), scandium (Sc), or other suitable chemical elements. The dipole elements can be driven into the gate dielectric layer 279 from the dipole layer 410, for example, by an annealing process. In the present embodiment, the dipole elements are selected such that they reduce the threshold voltage of the transistor 200B. In an embodiment where the transistor 200B is an n-type transistor, the dipole elements may be lanthanum, yttrium, strontium, or some other chemical elements, and the dipole layer 410 may include an oxide or a nitride of the dipole elements. For example, the dipole layer 410 may include $La_2O_3$, $Y_2O_3$, SrO, LaN, YN, $Sr_3N_2$, or other suitable materials. In an embodiment where the transistor 200B is a p-type transistor, the dipole elements may be aluminum, titanium, niobium, or scandium, or some other chemical elements, and the dipole layer 410 may include an oxide or a nitride of the dipole elements. For example, the dipole layer 410 may include $Al_2O_3$, $TiO_2$, niobium oxide (e.g., $Nb_2O_5$), AlN, TiN, NbN, or other suitable materials. In various embodiments, the dipole layer 410 may be deposited by ALD, CVD, or other suitable methods. Further, the dipole layer 410 is deposited to a substantially uniform thickness about 0.5 nm or less to about 1 nm in various embodiments. In the embodiment depicted in FIG. 4A, the dipole layer 410 is deposited to surround each of the channel layers 215 that are suspended over the substrate 202 as well as over the surfaces of the channel layer 215 that is disposed on the substrate 202. In embodiments where the transistors 200A through 200D are FinFETs (see FIGS. 2D and 2E for an example), the dipole layer 410 is deposited over the top and sidewall surfaces of the fin 215.

Figure 4B:
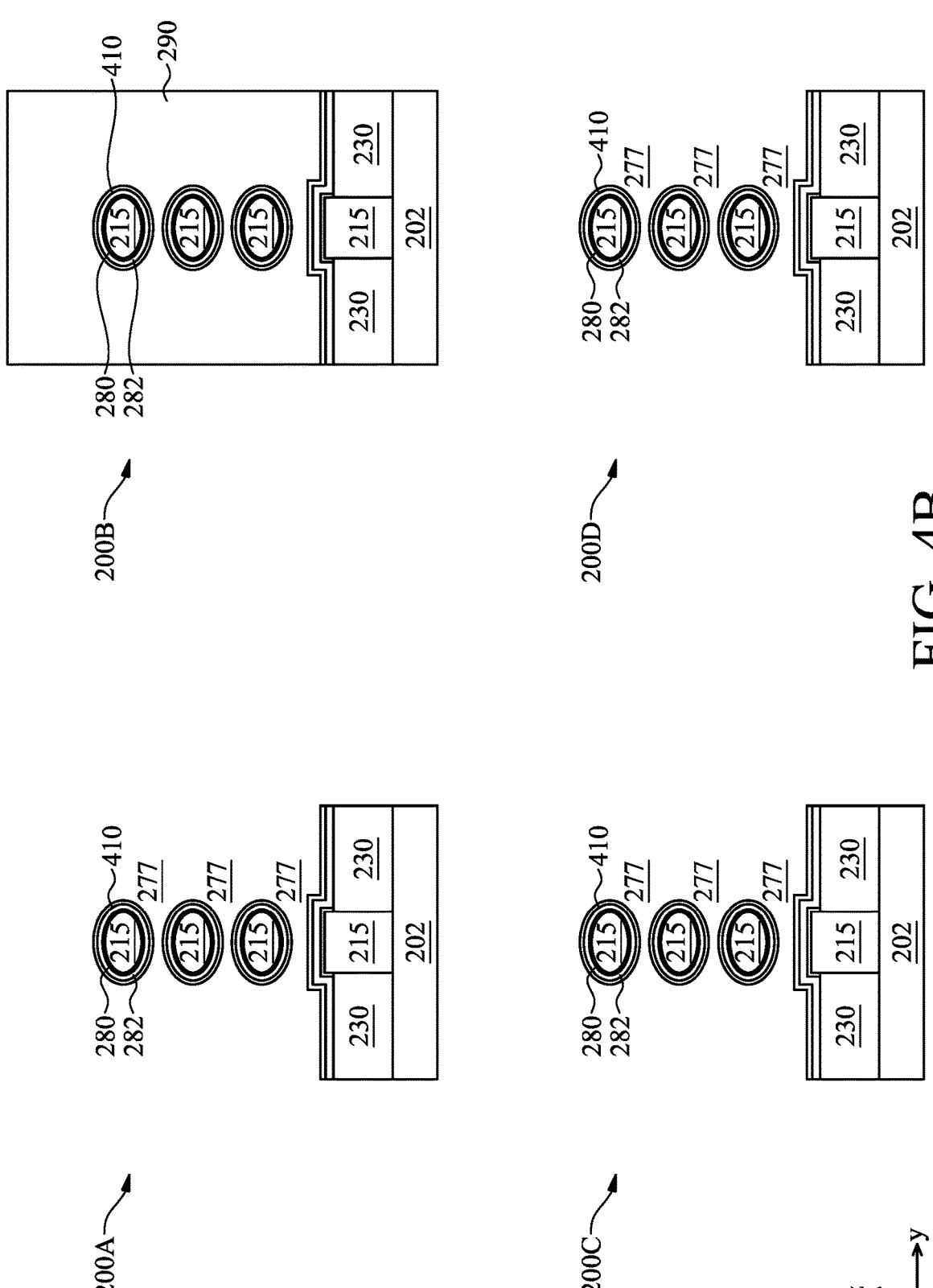

Turning to FIG. 4B, the method 100 forms an etch mask 290 that covers the transistor 200B and exposes the transistors 200A, 200C, and 200D. The mask 290 includes a material that is different than a material of the dipole layer 410 to achieve etching selectivity during the etching of the dipole layer 410. For example, the mask 290 may include a resist material (and thus may be referred to as a patterned resist layer and/or a patterned photoresist layer). In some embodiments, the mask 290 has a multi-layer structure, such as a resist layer disposed over an anti-reflective coating (ARC) layer. The present disclosure contemplates other materials for the mask 290, so long as etching selectivity is achieved during the etching of the dipole layer 410. In some embodiments, the operation 106 includes a lithography process that includes forming a resist layer over the device 200 (e.g., by spin coating), performing a pre-exposure baking process, performing an exposure process using a photomask, performing a post-exposure baking process, and developing the exposed resist layer in a developer solution. After development, the patterned resist layer (e.g., patterned mask 290) includes a resist pattern that corresponds with the photomask, where the patterned resist layer covers the transistor 200B and exposes the transistors 200A, 200C, and 200D. Alternatively, the exposure process can be implemented or replaced by other methods, such as maskless lithography, e-beam writing, ion-beam writing, or combinations thereof.

Figure 4C:
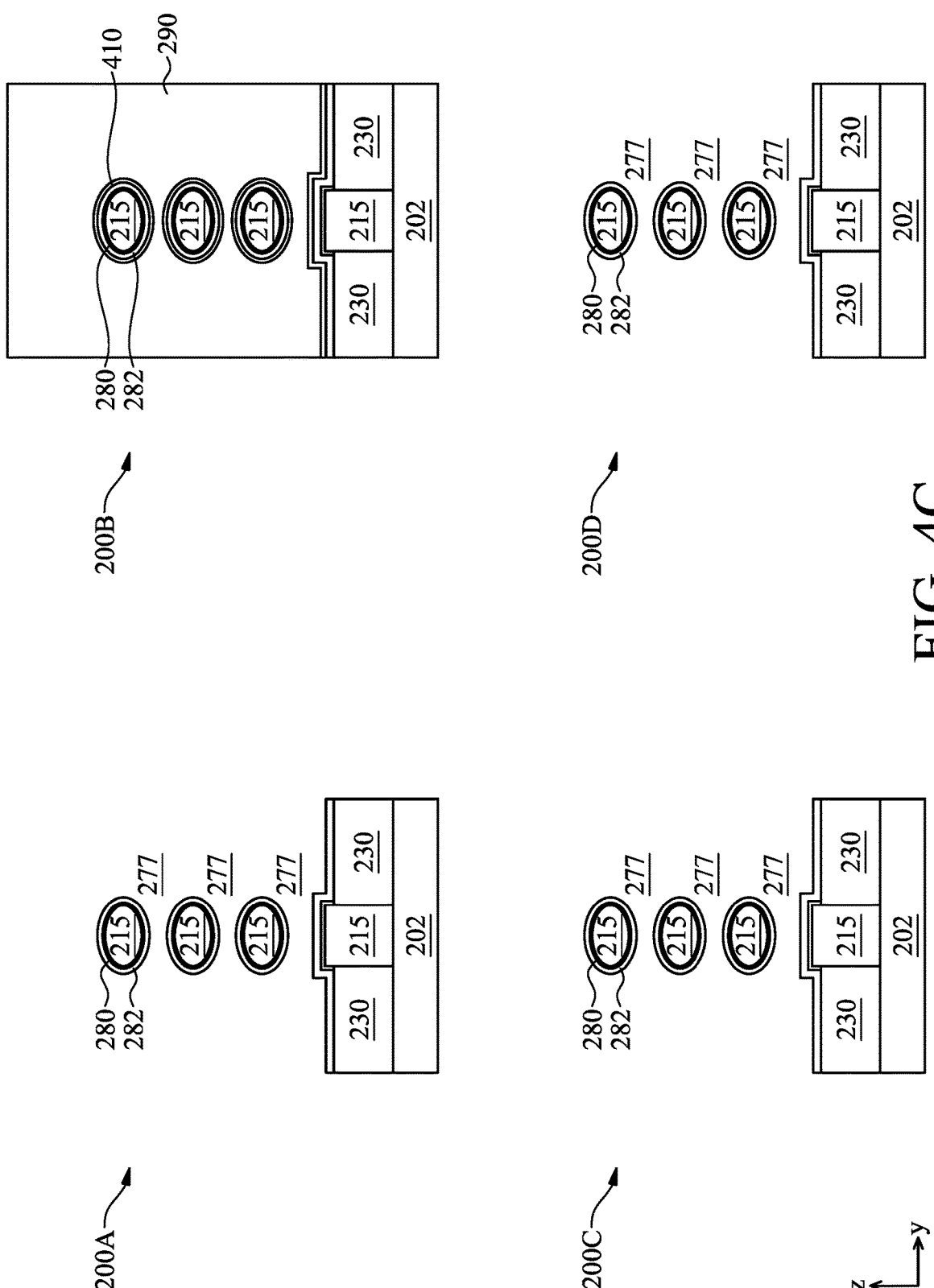

With the etch mask 290 in place, the operation 106 then etches the dipole layer 410 and removes it from the transistors 200A, 200C, and 200D, such as shown in FIG. 4C. The dipole layer 410 in the transistor 200B is protected by the etch mask 290 from the etching process. The etching process completely removes the dipole layer 410 around the channel layers 215 and between the channel layers 215 and the substrate 202 in the transistors 200A, 200C, and 200D, thereby exposing the high-k dielectric layer 282 in those transistors. The etching process can be a dry etching process, a wet etching process, or a reactive ion etching process that has a high etching selectivity with respect to the dipole layer 410 relative to the high-k dielectric layer 282. In some embodiments, the etching process is a wet etching process that uses an etching solution having a high etching selectivity with respect to the dipole layer 410 relative to the high-k dielectric layer 282. For example, the etching selectivity can be about 10 to about 100 or can be greater than 100. Parameters of the etching process (such as etching temperature, etching solution concentration, etching time, other suitable wet etching parameters, or combinations thereof) are controlled to ensure complete removal of the dipole layer 410 in the transistors 200A, 200C, and 200D. For example, an etching time (i.e., how long the dipole layer 410 is exposed to a wet etching solution) is tuned to completely remove the dipole layer 410 with minimal (to no) etching of high-k dielectric layer 282. In some embodiments, the etching solution further has an etching selectivity with respect to dipole layer 410 relative to the mask 290. In some embodiments, the etching process partially etches the mask 290.

Figure 4D:
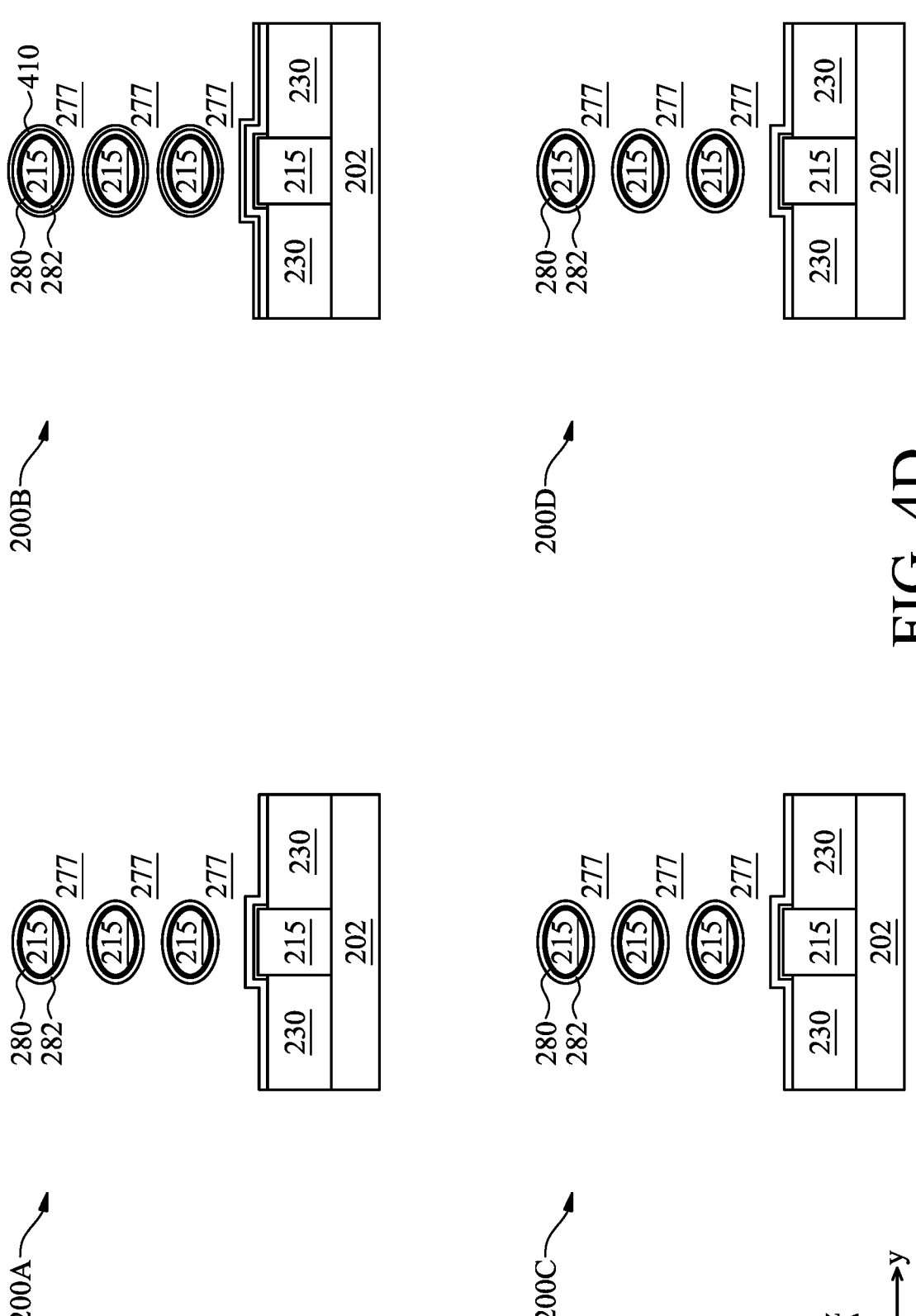

After the etching process, the mask 290 is removed, for example, by a resist stripping process or other suitable process at the operation 106 of the method 100 (FIG. 1). Turning to FIG. 4D, only the portion of the dipole layer 410 in the transistor 200B still remains, which becomes a dipole pattern 410. The dipole layer 410 is free from the transistors 200A, 200C, and 200D.

At operation 108, the method 100 (FIG. 1) forms a dipole pattern 420 over the gate dielectric layer 279 in the transistor 200D. Similar to the operation 106, the operation 108 may also involve a variety of processes such as deposition, photolithography, and etching. An embodiment of the operation 108 is illustrated in FIGS. 5A, 5B, 5C, and 5D, which illustrate cross-sectional views of the devices 200A, 200B, 200C, and 200D along the A2-A2, B2-B2, C2-C2, and D2-D2 lines of FIG. 2A, respectively, in various steps of the operation 108. Many aspects of the operation 108 are similar to those of the operation 106.

Figure 5A:
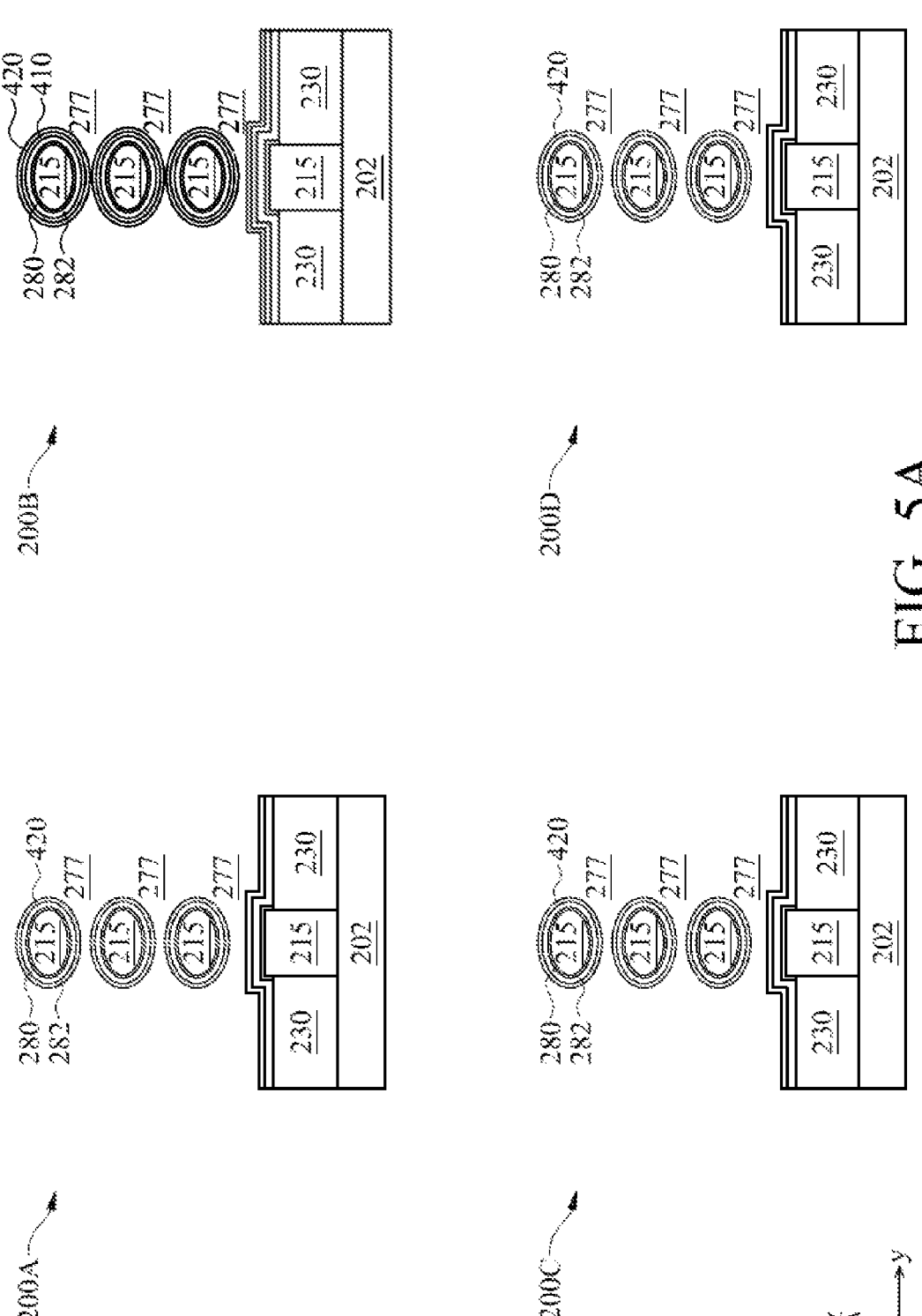

Turning to FIG. 5A, the method 100 deposits a dipole layer 420 over the gate dielectric layer 279 in the transistors 200A, 200C, and 200D and over the dipole pattern 410 in the transistor 200B. The dipole layer 420 includes a dielectric material for dipole formation in the gate dielectric layer 279 of the transistor 200D. The dielectric material can be an oxide, a nitride, or another compound, with one or more dipole elements. In some embodiments, the dipole elements can be lanthanum (La), yttrium (Y), strontium (Sr), aluminum (Al), titanium (Ti), niobium (Nb), erbium (Er), scandium (Sc), or other suitable chemical elements. The dipole elements can be driven into the gate dielectric layer 279 from the dipole layer 420, for example, by an annealing process. In the present embodiment, the dipole elements are selected such that they reduce the threshold voltage of the transistor 200D. In an embodiment where the transistor 200D is an n-type transistor, the dipole elements may be lanthanum, yttrium, strontium, or some other chemical elements, and the dipole layer 420 may include an oxide or a nitride of the dipole elements. For example, the dipole layer 420 may include $La_2O_3$, $Y_2O_3$, SrO, LaN, YN, $Sr_3N_2$, or other suitable materials. In an embodiment where the transistor 200D is a p-type transistor, the dipole elements may be aluminum, titanium, niobium, or scandium, or some other chemical elements, and the dipole layer 420 may include an oxide or a nitride of the dipole elements. For example, the dipole layer 420 may include $Al_2O_3$, $TiO_2$, niobium oxide (e.g., $Nb_2O_5$), MN, TiN, NbN, or other suitable materials. In the present embodiment, the dipole layer 420 and the dipole pattern 410 are for opposite conductivity-type transistors. For example, the dipole pattern 410 is for n-type transistor, and the dipole layer 420 is for p-type transistor or vice versa. In various embodiments, the dipole layer 420 may be deposited by ALD, CVD, or other suitable methods. Further, the dipole layer 420 is deposited to a substantially uniform thickness about 0.5 nm or less to about 1 nm in various embodiments. In the embodiment depicted in FIG. 5A, the dipole layer 420 is deposited to surround each of the channel layers 215 that are suspended over the substrate 202 as well as over the surfaces of the channel layer 215 that is disposed on the substrate 202. In embodiments where the transistors 200A through 200D are FinFETs (see FIGS. 2D and 2E for an example), the dipole layer 420 is deposited over the top and sidewall surfaces of the channel layer 215.

Figure 5B:
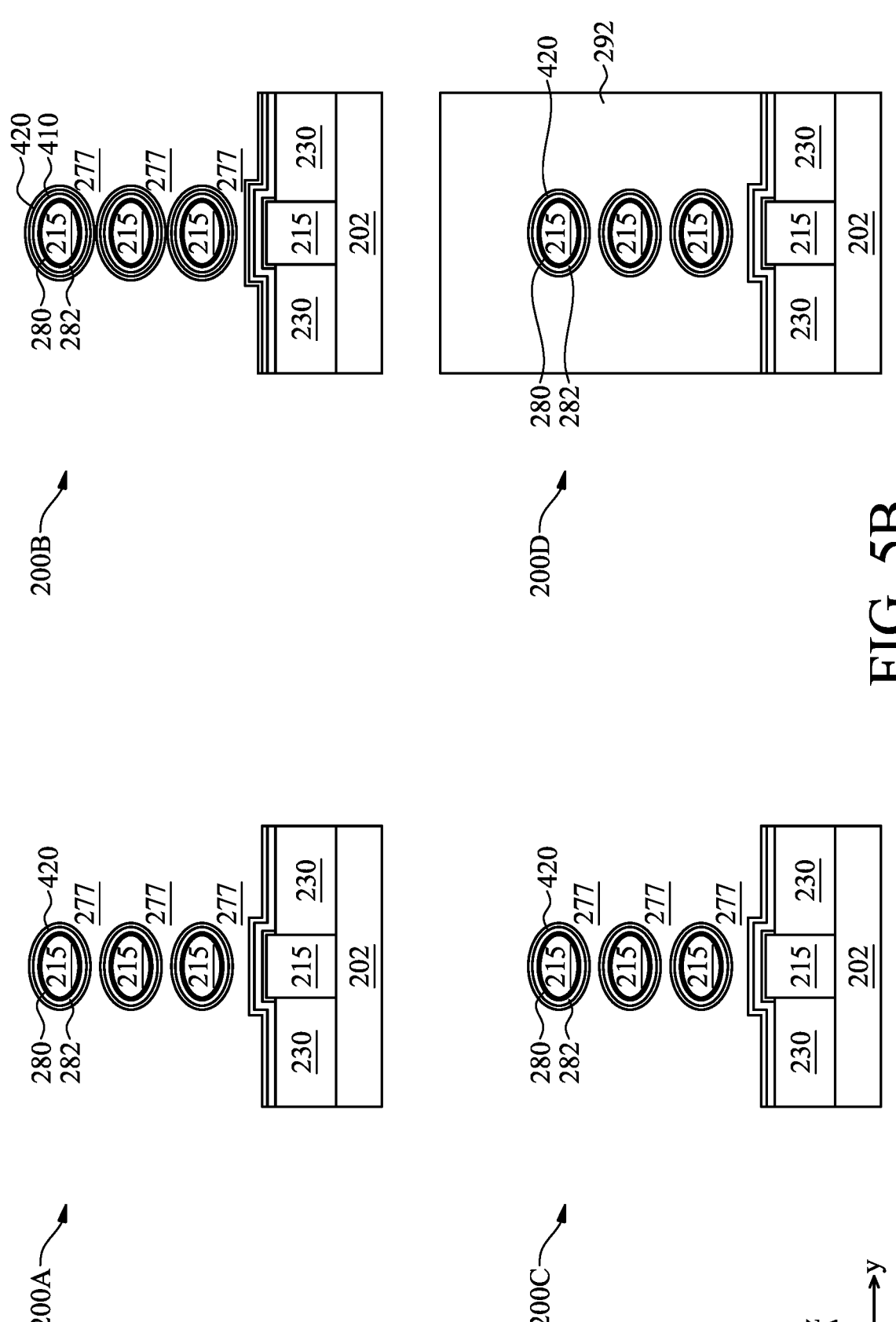

Turning to FIG. 5B, the method 100 forms an etch mask 292 that covers the transistor 200D and exposes the transistors 200A, 200B, and 200C. The mask 292 includes a material that is different than a material of the dipole layer 420 to achieve etching selectivity during the etching of the dipole layer 420. For example, the mask 292 may include a resist material or a resist layer disposed over an anti-reflective coating (ARC) layer. The operation 108 may use a lithography process to create the mask 292, similar to the process discussed with respect to the mask 290.

Figure 5C:
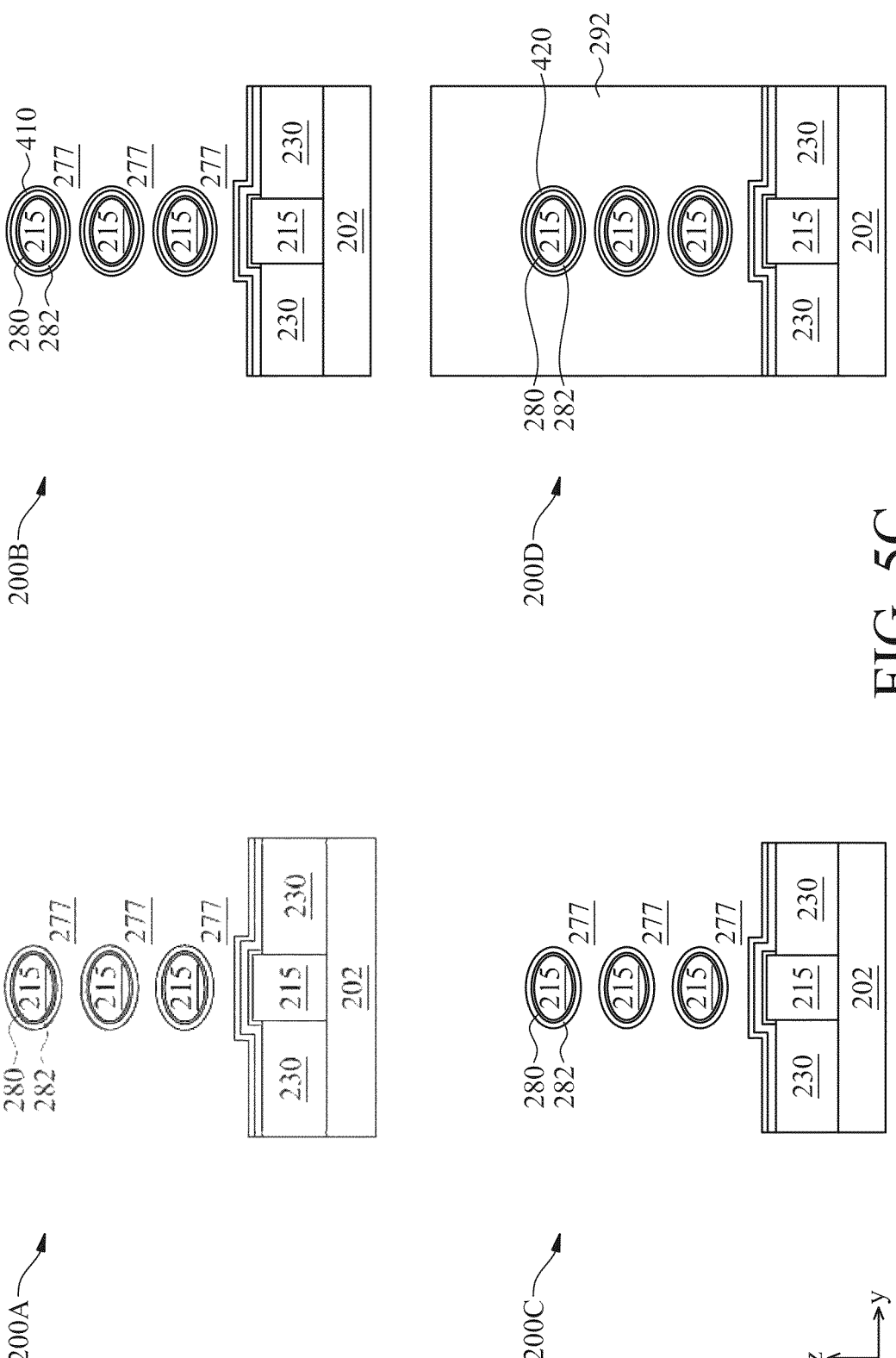

With the etch mask 292 in place, the operation 108 then etches the dipole layer 420 and removes it from the transistors 200A, 200B, and 200C, such as shown in FIG. 5C. The dipole layer 420 in the transistor 200D is protected by the etch mask 292 from the etching process. The etching process completely removes the dipole layer 420 around the channel layers 215 and between the channel layers 215 and the substrate 202 in the transistors 200A, 200B, and 200C, thereby exposing the high-k dielectric layer 282 in the transistors 200A and 200C and the dipole pattern 410 in the transistor 200B. The etching process can be a dry etching process, a wet etching process, or a reactive ion etching process that has a high etching selectivity with respect to the dipole layer 420 relative to the high-k dielectric layer 282 and the dipole pattern 410. In some embodiments, the etching solution further has an etching selectivity with respect to dipole layer 420 relative to the mask 292. In some embodiments, the etching process partially etches the mask 292.

Figure 5D:
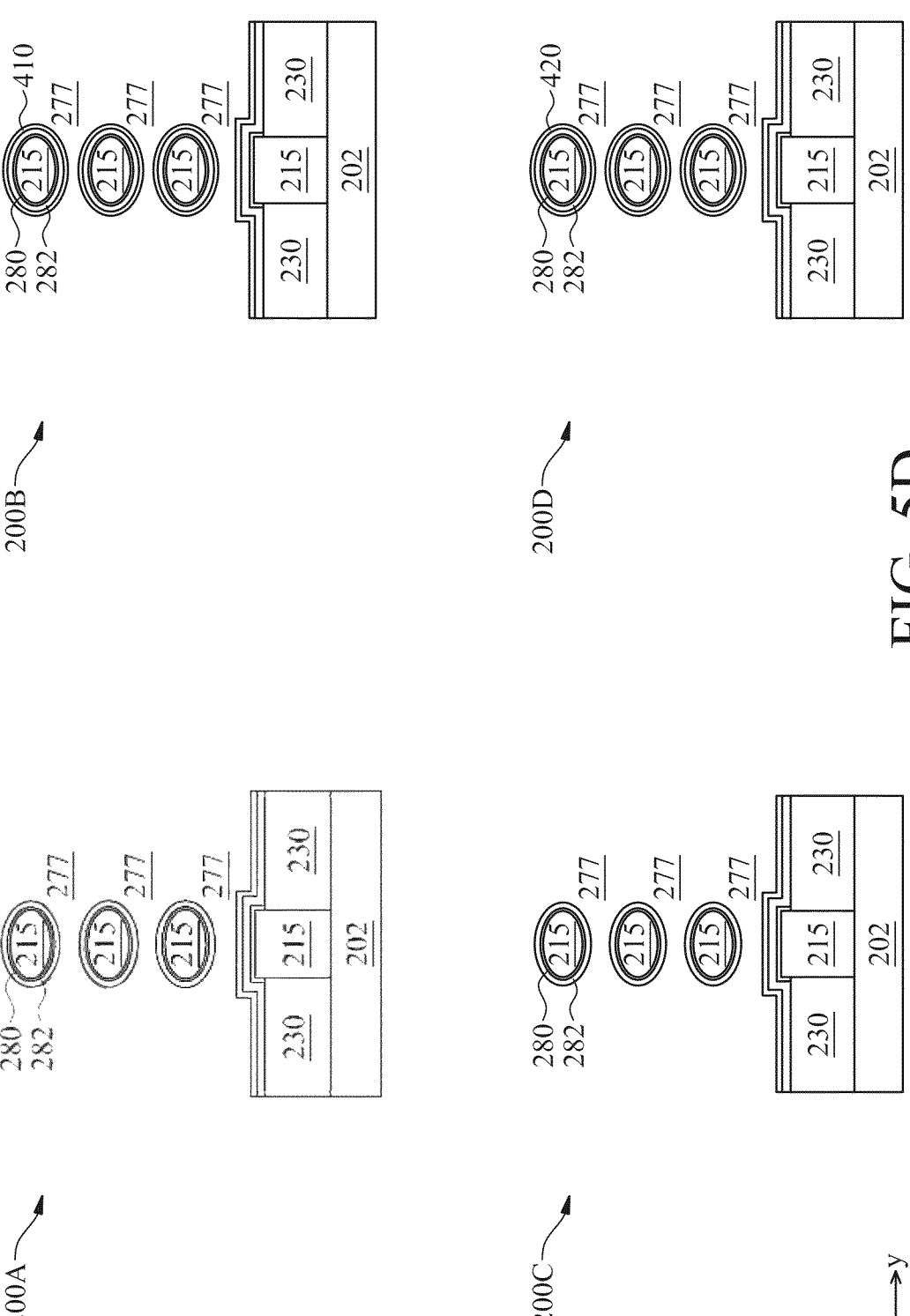

After the etching process, the mask 292 is removed, for example, by a resist stripping process or other suitable process at the operation 108 of the method 100 (FIG. 1). Turning to FIG. 5D, only the portion of the dipole layer 420 in the transistor 200D still remains, which becomes a dipole pattern 420. The dipole layer 420 is free from the transistors 200A, 200B, and 200C.

Figure 6:
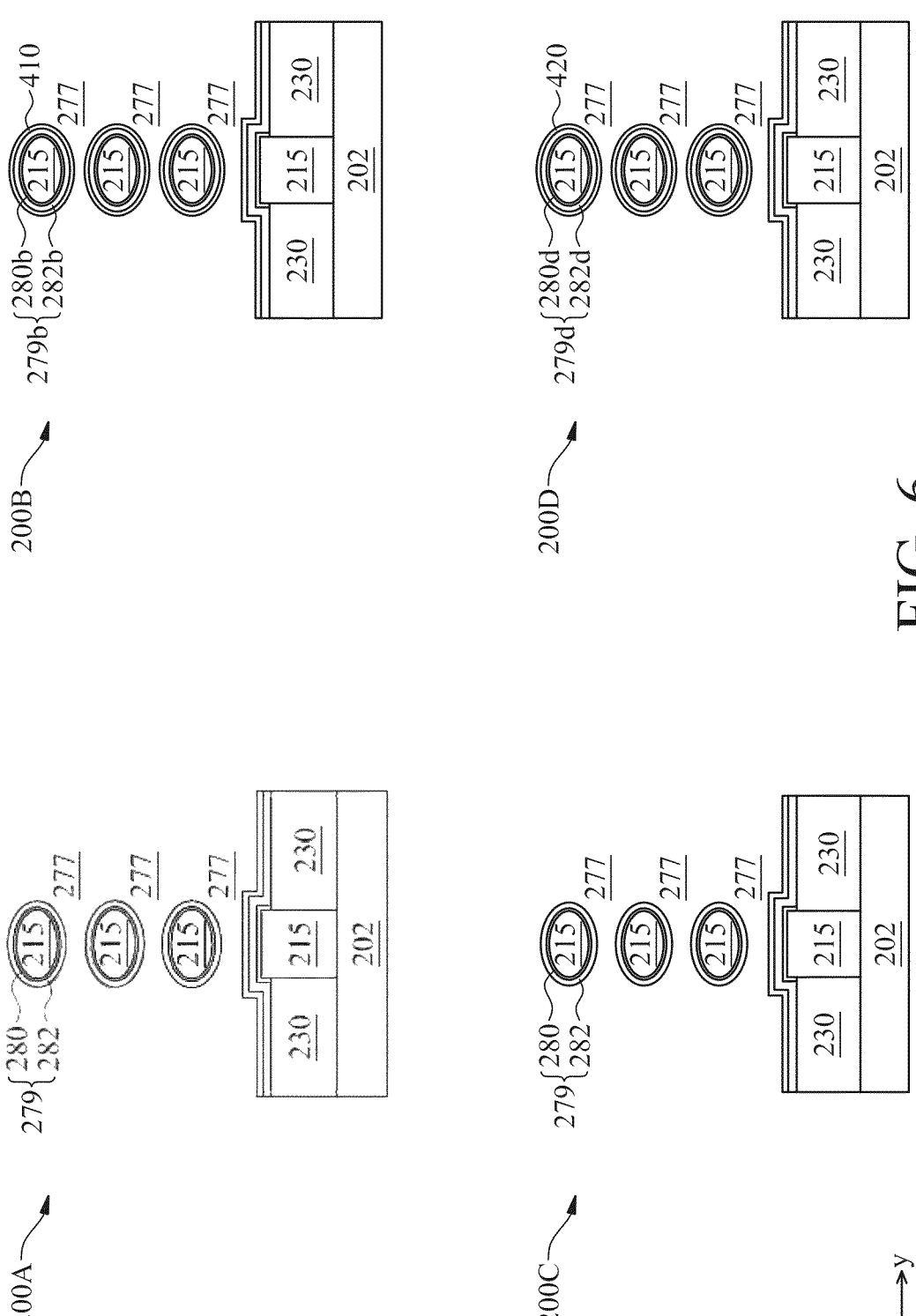

At operation 110, the method 100 (FIG. 1) performs a dipole drive-in process to the device 200 so that the dipole materials from the dipole patterns 410 and 420 are driven into the gate dielectric layer 279 of the transistors 200B and 200D. In the present embodiment, the dipole drive-in process is an annealing process, such as rapid thermal annealing (RTA), millisecond annealing (MSA), microsecond annealing (μSA), or other suitable annealing processes. In the present embodiment, the annealing temperature is controlled to be in a range from about 500° C. to about 900° C., such as from about 600° C. to about 800° C. The temperature is selected such that it does not adversely affect the existing structures and features of the device 200 and is yet sufficient to cause the dipole elements to migrate (or diffuse) from the dipole patterns 410 and 420 into the respective gate dielectric layers thereunder. In the present embodiment, the thickness of the interfacial layer 280 and the high-k dielectric layer 282 are designed so that the dipole materials can effectively permeate through these layers or at least through the high-k dielectric layer 282. For example, the interfacial layer 280 may have a thickness of about 0.7 nm to about 1.5 nm and the high-k dielectric layer 282 may have a thickness of about 1.2 nm to about 2.5 nm. After the dipole drive-in process, the high-k dielectric layer 282 in the transistors 200B and 200D become high-k dielectric layers 282b and 282d respectively; and the interfacial layer 280 in the transistors 200B and 200D become interfacial layers 280b and 280d respectively. The high-k dielectric layers 282b and 282d become different from the high-k dielectric layer 282 after incorporation of the dipole materials therein. Additionally, in some embodiments, the interfacial layers 280b and 280d become different from the interfacial layer 280 because the dipole materials are also driven into them. As depicted in FIG. 6, the gate dielectric layer 279b of the transistor 200B is now different from the gate dielectric layer 279 of the transistor 200A; and the gate dielectric layer 279d of the transistor 200D is now different from the gate dielectric layer 279 of the transistor 200C.

Figure 7:
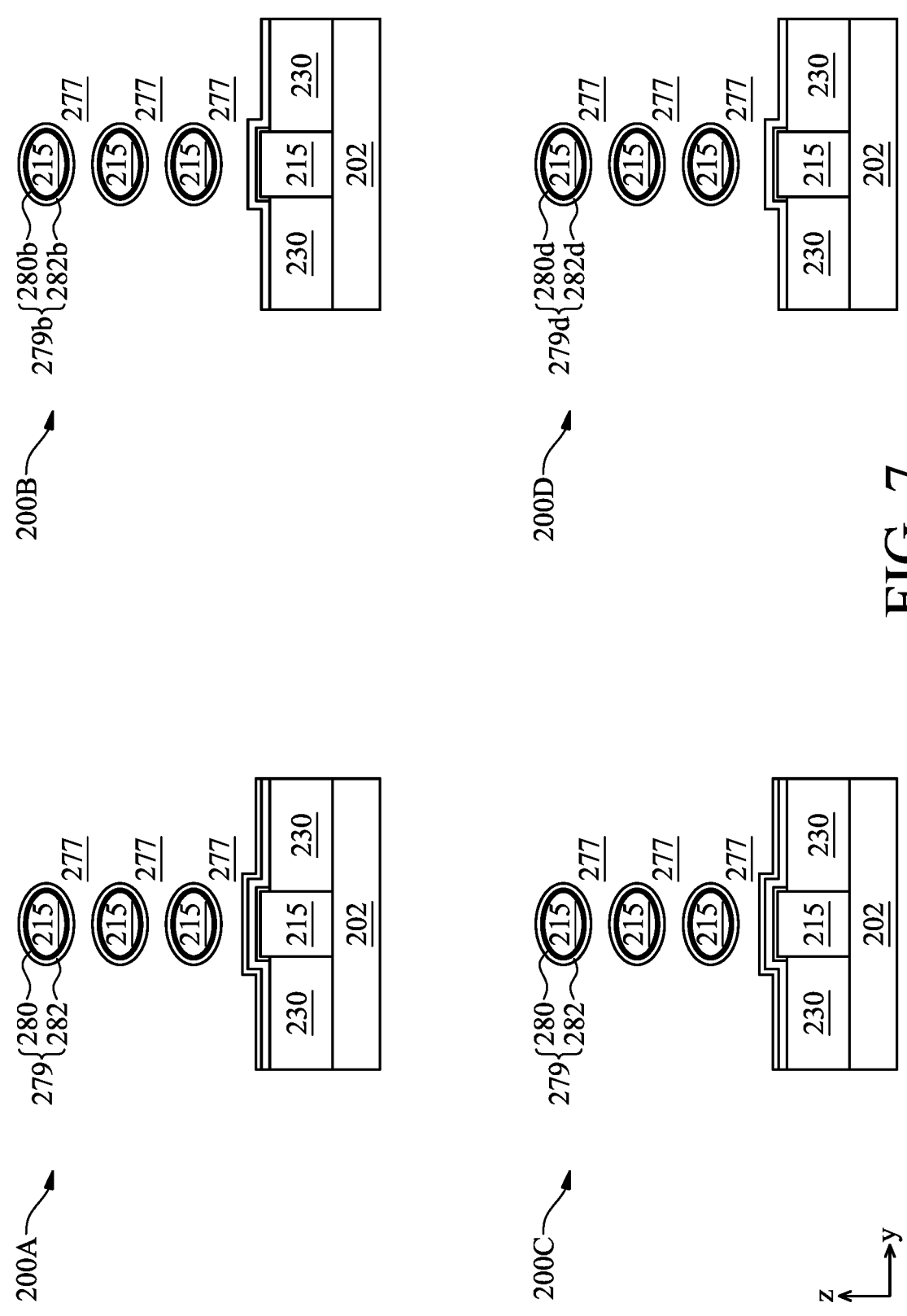

At operation 112, the method 100 (FIG. 1) removes the dipole patterns 410 and 420 from the device 200 by applying one or more etching processes. The resultant structure is shown in FIG. 7. The etching process can be a dry etching process, a wet etching process, a reactive ion etching process, or another etching process and has a high etching selectivity with respect to the dipole patterns 410 and 420 relative to the high-k dielectric layer 282. The operation 112 is optional and can be omitted in some embodiments. When the operation 112 is omitted, the dipole patterns 410 and 420 remain in the transistors 200B and 200D, respectively.

Figures 8A, 8B:
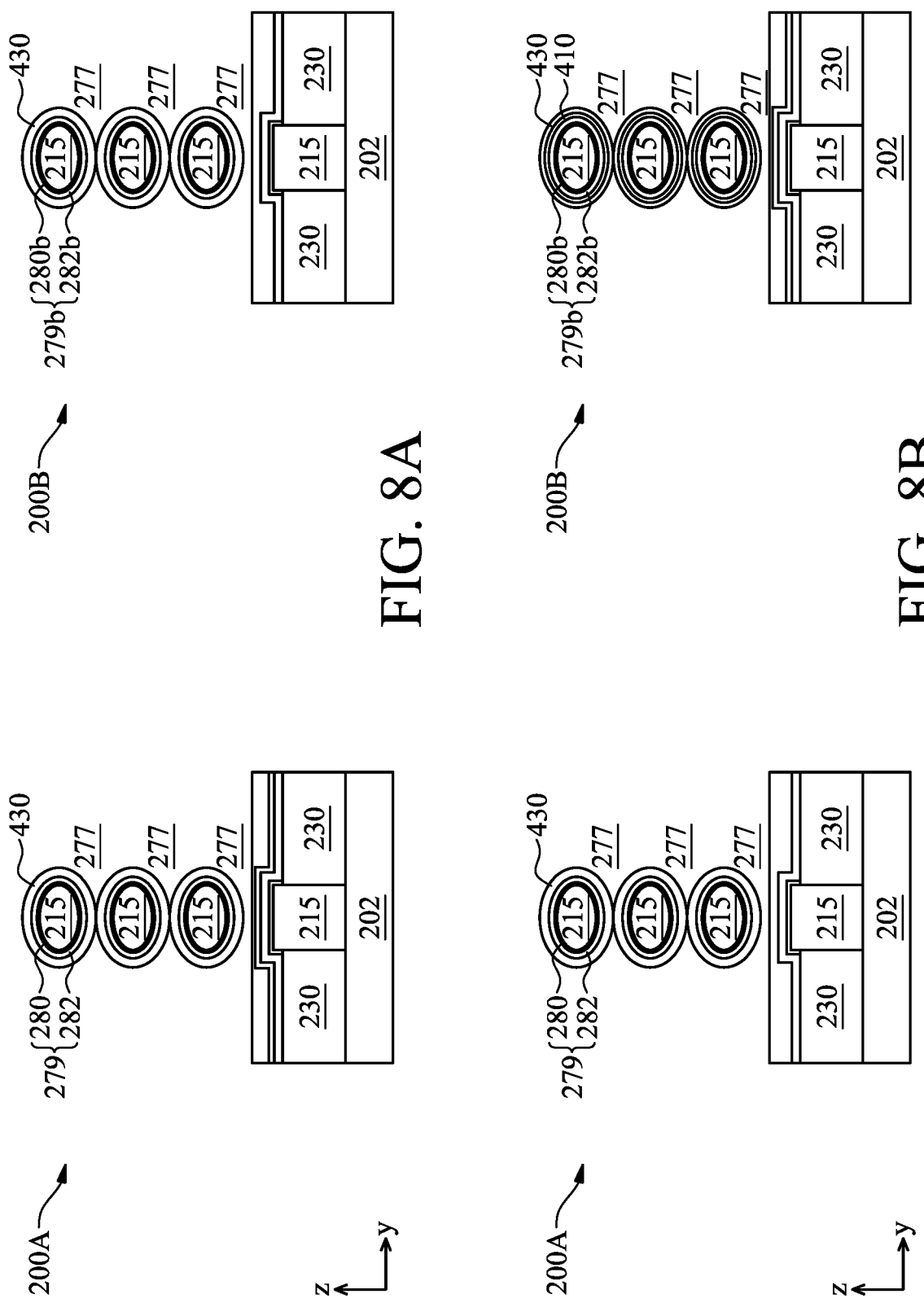

At operation 114, the method 100 (FIG. 1) forms a work function metal layer 430 over the transistors 200A and 200B, such as shown in FIG. 8A. The work function metal layer 430 is designed to provide a proper work function for the type of the transistors 200A and 200B. In embodiments where the transistors 200A and 200B are n-type transistors, the work function metal layer 430 includes an n-type work function metal, such as Ti, Al, Ag, Mn, Zr, TiC, TiAl, TiAlC, TiAlSiC, TaC, TaCN, TaSiN, TaAl, TaAlC, TaSiAlC, TiAlN, other n-type work function material, or combinations thereof. In embodiments where the transistors 200A and 200B are p-type transistors, the work function metal layer 430 includes a p-type work function metal, such as TiN, TaN, TaSN, Ru, Mo, Al, WN, WCN, ZrSi$_2$, MoSi$_2$, TaSi$_2$, NiSi$_2$, other p-type work function material, or combinations thereof. In some embodiments, the work function metal layer 430 has a thickness of about 2 nm to about 5 nm.

The operation 114 may include a variety of processes such as deposition, lithography, and etching. For example, it may deposit the work function metal layer 430 over the transistors 200A, 200B, 200C, and 200D. Then, it forms an etch mask that covers the transistors 200A and 200B and exposes the transistors 200C and 200D. Subsequently, it removes the work function metal layer 430 from the transistors 200C and 200D using one or more etching process. Finally, it removes the etch mask.

Referring to FIG. 8A, the transistors 200A and 200B are of the same conductivity-type (i.e., both are n-type or p-type) and they have the same work function metal layer 430. However, the gate dielectric layer 279b (280b/282b) includes a higher amount of a dipole material than the gate dielectric layer 279, as discussed earlier. Thus, the transistor 200B has a lower threshold voltage than the transistor 200A.

FIG. 8B illustrates an embodiment of the device 200 where the dipole pattern 410 is kept in the device (i.e., the operation 112 is omitted relative to the dipole pattern 410). The dipole pattern 410 is disposed between the high-k dielectric layer 282b and the work function metal layer 430.

Figures 9A, 9B:
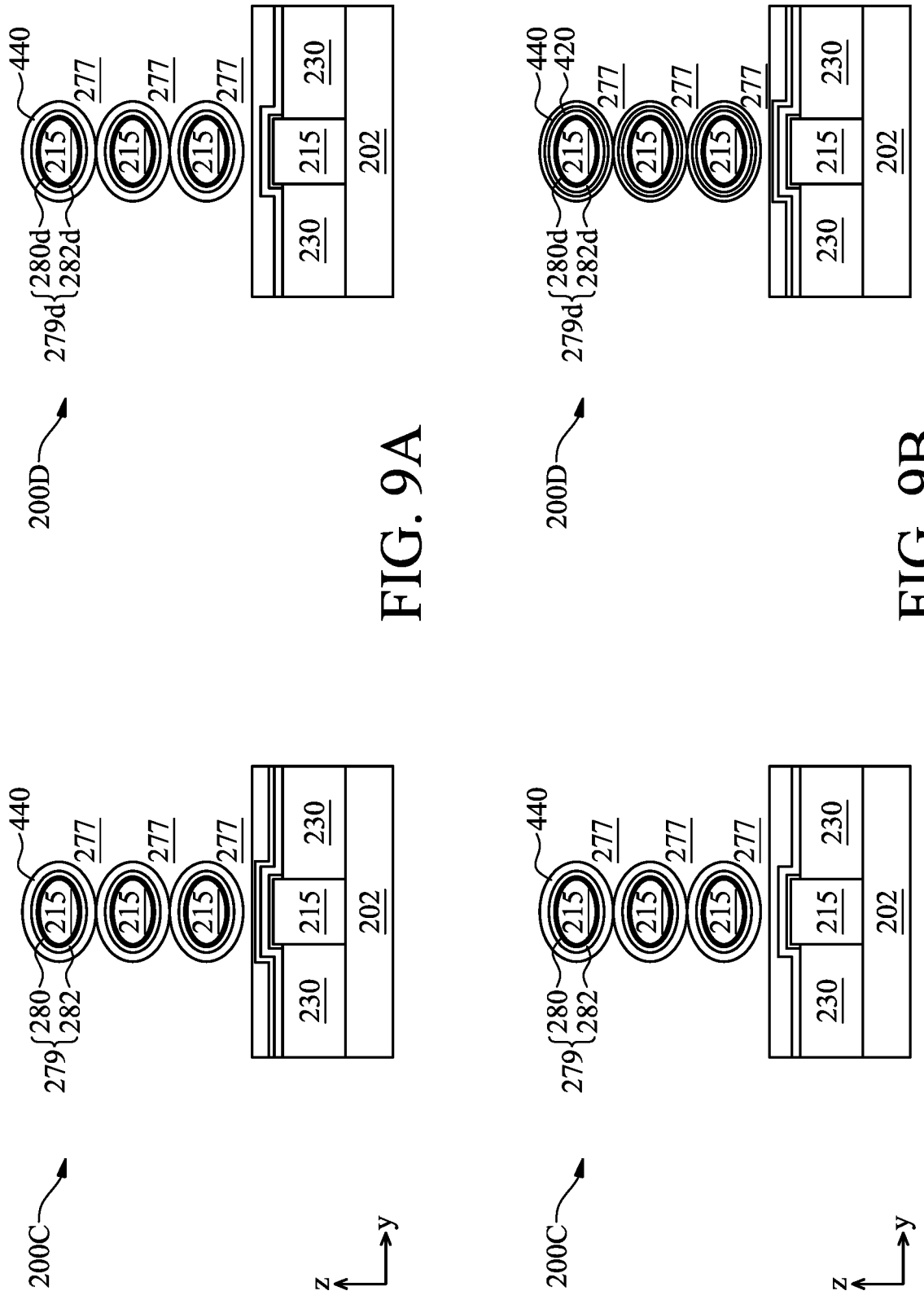

At operation 116, the method 100 (FIG. 1) forms a work function metal layer 440 over the transistors 200C and 200D, such as shown in FIG. 9A. The work function metal layer 440 is designed to provide a proper work function for the type of the transistors 200C and 200D. In embodiments where the transistors 200C and 200D are n-type transistors, the work function metal layer 440 includes an n-type work function metal, such as Ti, Al, Ag, Mn, Zr, TiC, TiAl, TiAlC, TiAlSiC, TaC, TaCN, TaSiN, TaAl, TaAlC, TaSiAlC, TiAlN, other n-type work function material, or combinations thereof. In embodiments where the transistors 200C and 200D are p-type transistors, the work function metal layer 440 includes a p-type work function metal, such as TiN, TaN, TaSN, Ru, Mo, Al, WN, WCN ZrSi$_2$, MoSi$_2$, TaSi$_2$, NiSi$_2$, other p-type work function material, or combinations thereof. In some embodiments, the work function metal layer 440 has a thickness of about 2 nm to about 5 nm. In the present embodiment, the work function metal layers 430 and 440 are of different conductivity type (i.e., one for n-type and the other for p-type).

The operation 116 may include a variety of processes such as deposition, lithography, and etching. For example, it may deposit the work function metal layer 440 over the transistors 200A, 200B, 200C, and 200D. Then, it forms an etch mask that covers the transistors 200C and 200D and exposes the transistors 200A and 200B. Subsequently, it removes the work function metal layer 440 from the transistors 200A and 200B using one or more etching process. Finally, it removes the etch mask.

Referring to FIG. 9A, the transistors 200C and 200D are of the same conductivity-type (i.e., both are n-type or p-type) and they have the same work function metal layer 440. However, the gate dielectric layer 279d (280d/282d) includes a higher amount of a dipole material than the gate dielectric layer 279, as discussed earlier. Thus, the transistor 200D has a lower threshold voltage than the transistor 200C.

FIG. 9B illustrates an embodiment of the device 200 where the dipole pattern 420 is kept in the device (i.e., the operation 112 is omitted relative to the dipole pattern 420). The dipole pattern 420 is disposed between the high-k dielectric layer 282d and the work function metal layer 440.

Figure 10A:
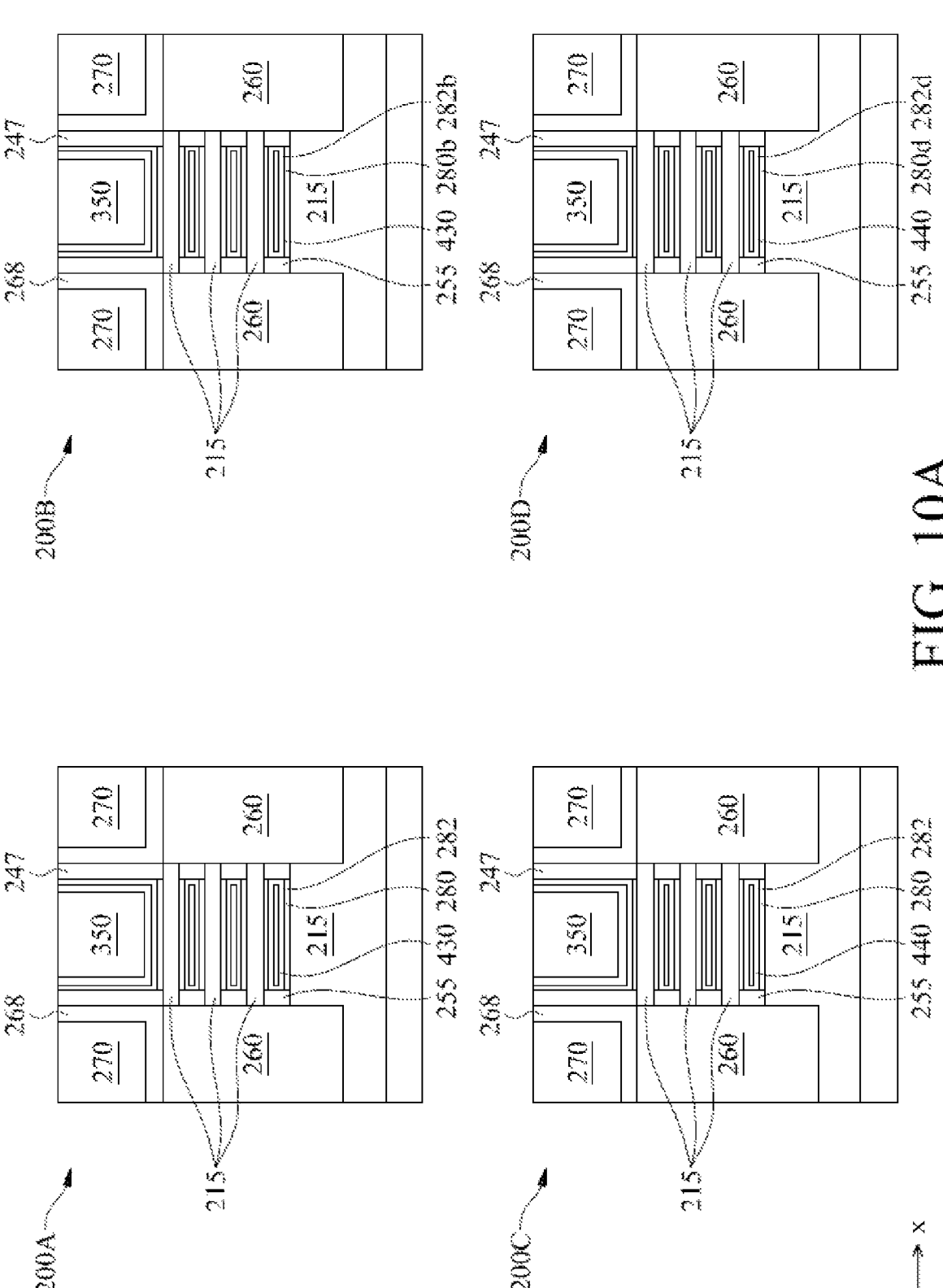
Figure 10B:
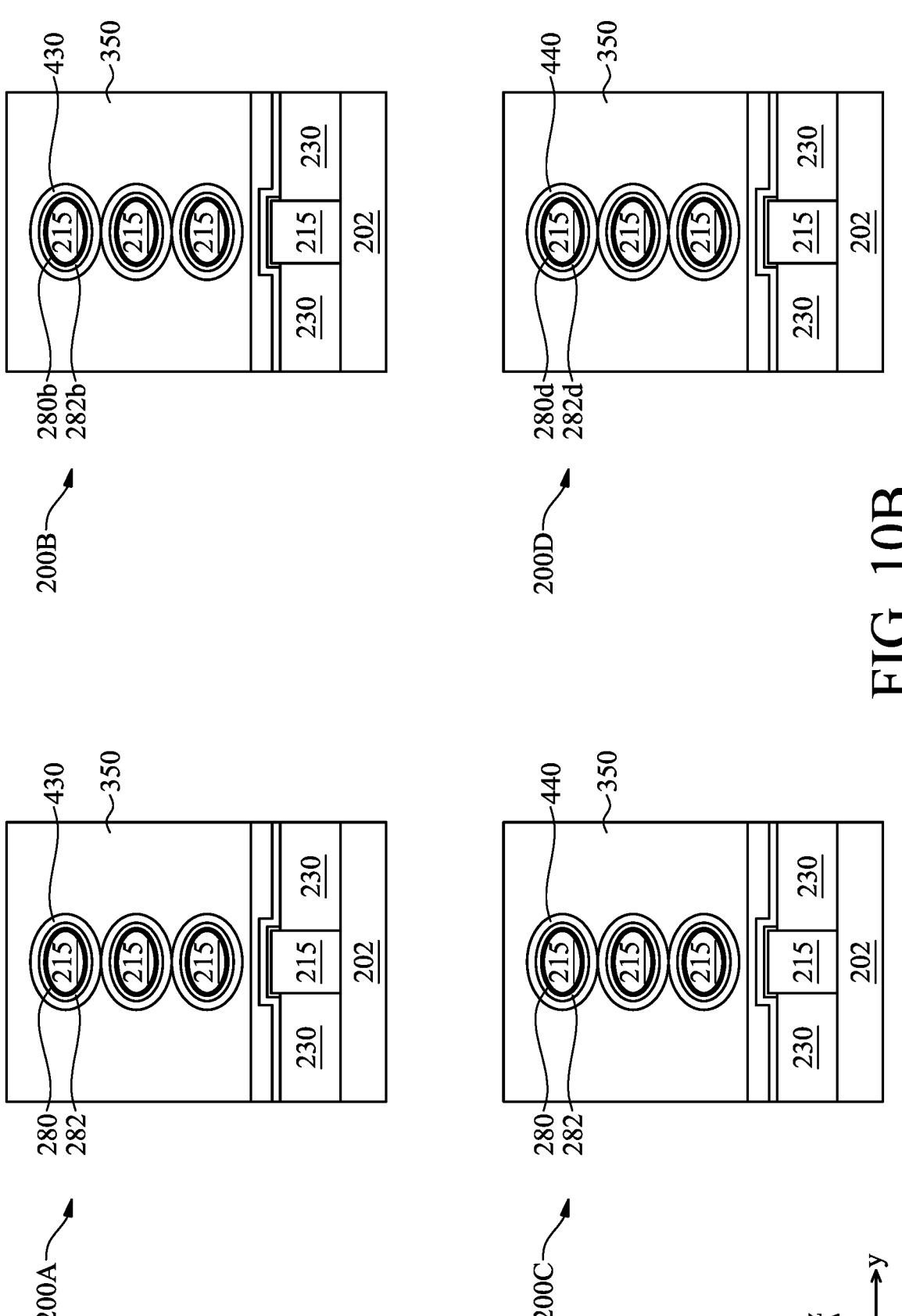

At operation 118, the method 100 (FIG. 1) performs further fabrication to the device 200. For example, it may form a bulk metal layer 350 over the work function metal layers 430 and 440, such as shown in FIGS. 10A and 10B. FIG. 10A illustrates the transistors 200A, 200B, 200C, and 200D along the A1-A1, B1-B1, C1-C1, and D1-D1 lines of FIG. 2A, respectively, at this fabrication stage; and FIG. 10B illustrates the transistors 200A, 200B, 200C, and 200D along the A2-A2, B2-B2, C2-C2, and D2-D2 lines of FIG. 2A, respectively, at this fabrication stage. For example, a CVD process or a PVD process deposits the bulk metal layer 350, such that it fills any remaining portion of gate trenches 275 (see FIGS. 2B and 2C). The bulk metal layer 350 includes a suitable conductive material, such as Al, W, and/or Cu. The bulk metal layer 350 may additionally or collectively include other metals, metal oxides, metal nitrides, other suitable materials, or combinations thereof. In some implementations, a blocking layer (not shown) is optionally formed (e.g., by ALD) over the work function layer 430 and/or 440 before forming the bulk metal layer 350, such that the bulk metal layer 350 is disposed on the blocking layer. After the bulk metal layer 350 is deposited, a planarization process may then be performed to remove excess gate materials from the device 200. For example, a CMP process is performed until a top surface of ILD layer 270 is reached (exposed). The method 100 may perform other operations such as forming S/D contacts that electrically connect to the S/D features 260, forming gate vias that electrically connect to the bulk metal layer 350, and forming multi-layer interconnects that connect the transistors 200A, 200B, 200C, and 200D to various parts of the device 200 to form a complete IC. The transistors 200A and 200B are of the same conductivity-type and the transistor 200B has a lower Vt than the transistor 200A. The transistors 200C and 200D are of the same conductivity-type and the transistor 200D has a lower Vt than the transistor 200C. The conductivity-type of the transistors 200A and 200B is opposite to that of the transistors 200C and 200D. In an embodiment, the transistors 200A and 200B are n-type transistors, and the transistors 200C and 200D are p-type transistors. In an alternative embodiment, the transistors 200A and 200B are p-type transistors, and the transistors 200C and 200D are n-type transistors.

Figures 11A, 11B:
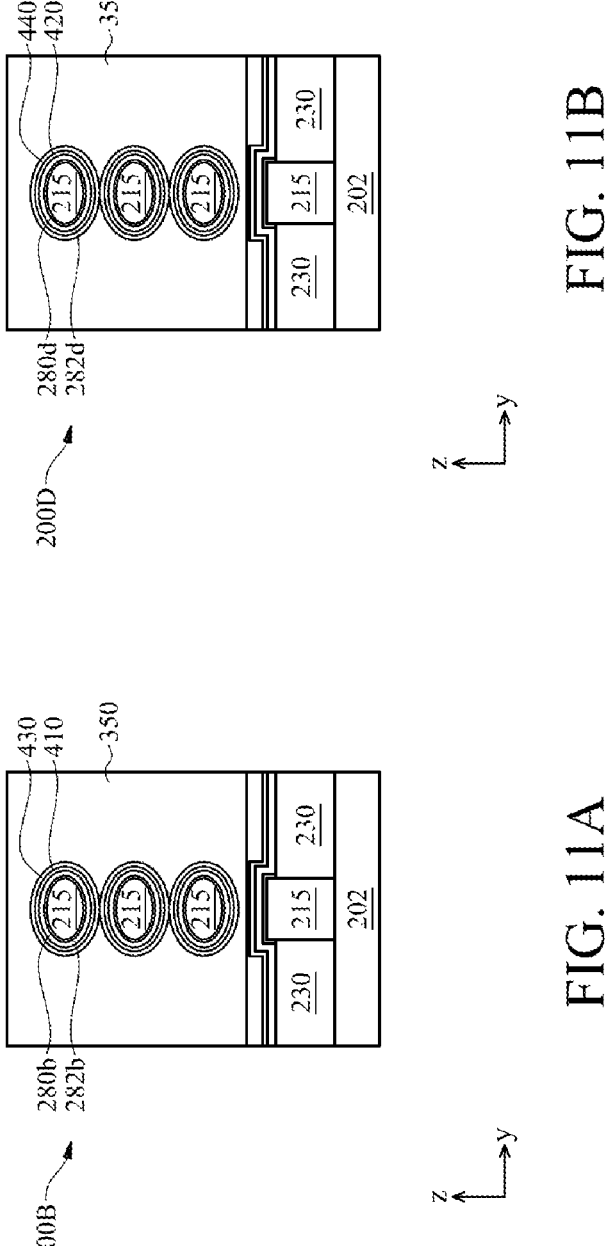

FIGS. 11A and 11B illustrate cross-sectional views of the device 200B and 200D along the B2-B2 and D2-D2 lines of FIG. 2A, respectively. FIG. 11A illustrates an embodiment of the transistor 200B where the dipole pattern 410 is kept in the device. As shown, the dipole pattern 410 is disposed in contact with the high-k dielectric layer 282b, the work function metal layer 430 is disposed in contact with the dipole pattern 410, and the bulk metal layer 350 is disposed over the work function metal layer 430. FIG. 11B illustrates an embodiment of the transistor 200D where the dipole pattern 420 is kept in the device. As shown, the dipole pattern 420 is disposed in contact with the high-k dielectric layer 282d, the work function metal layer 440 is disposed in contact with the dipole pattern 420, and the bulk metal layer 350 is disposed over the work function metal layer 440.

Figure 12A:
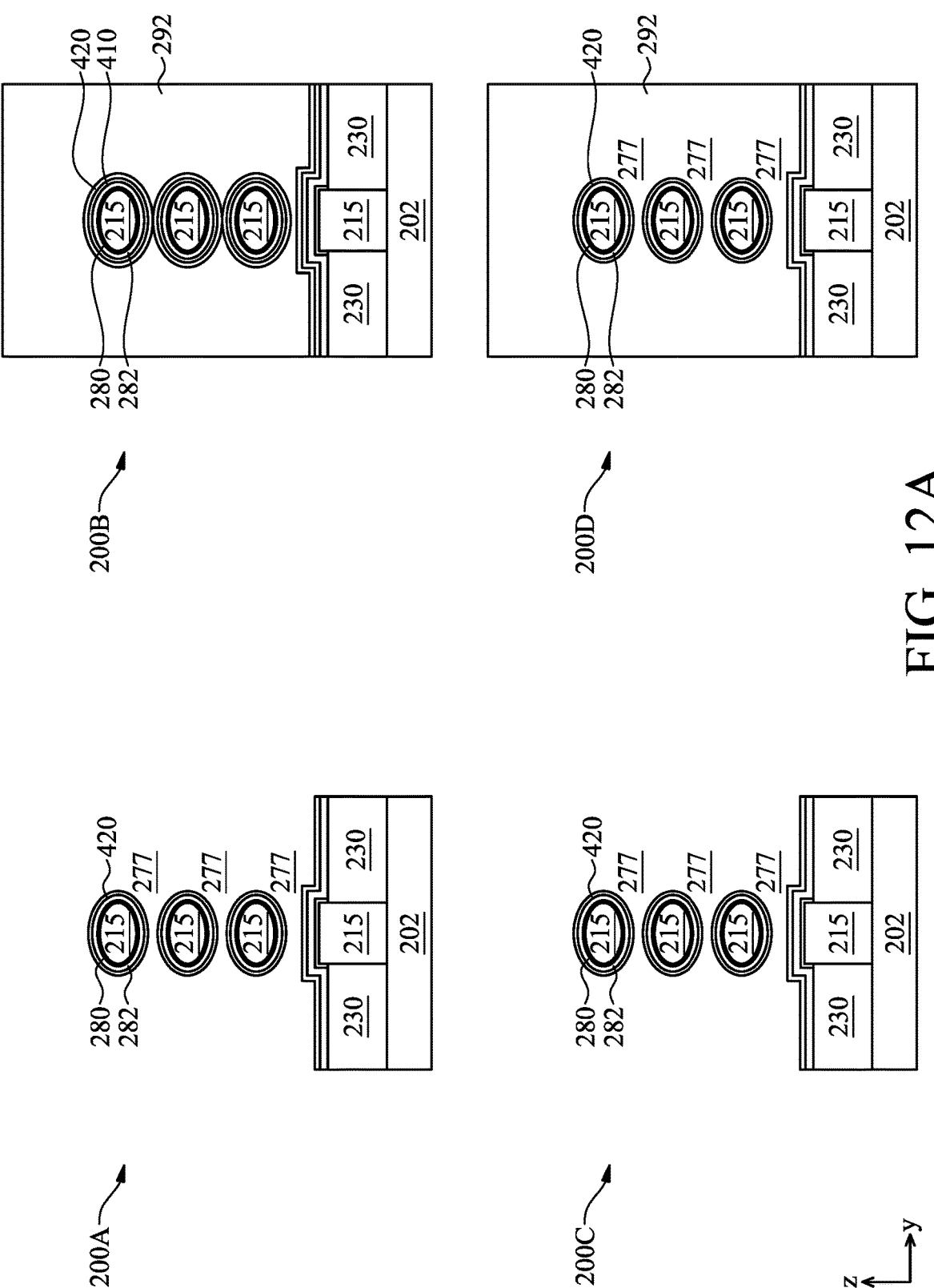
Figure 12B:
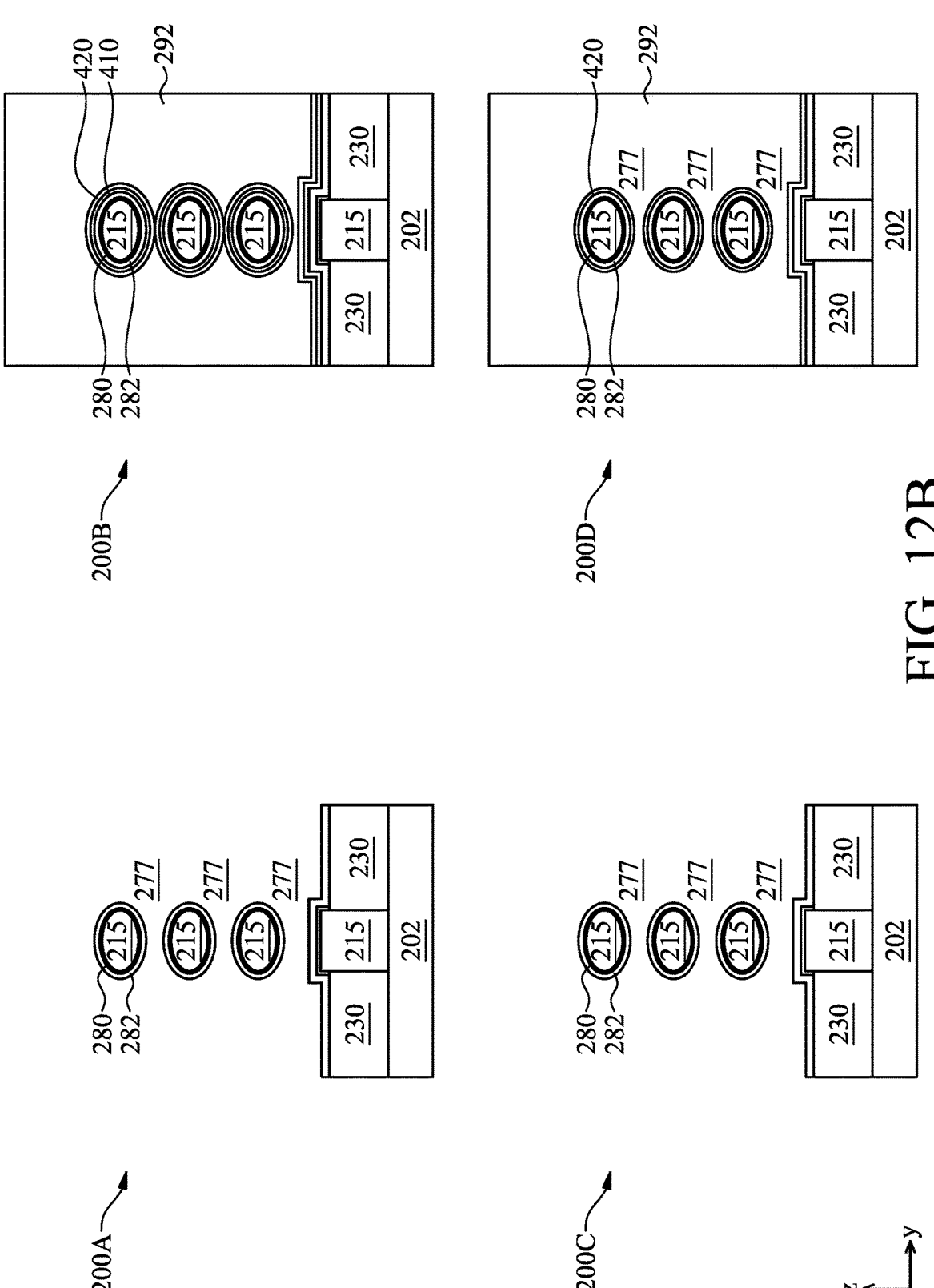
Figure 12C:
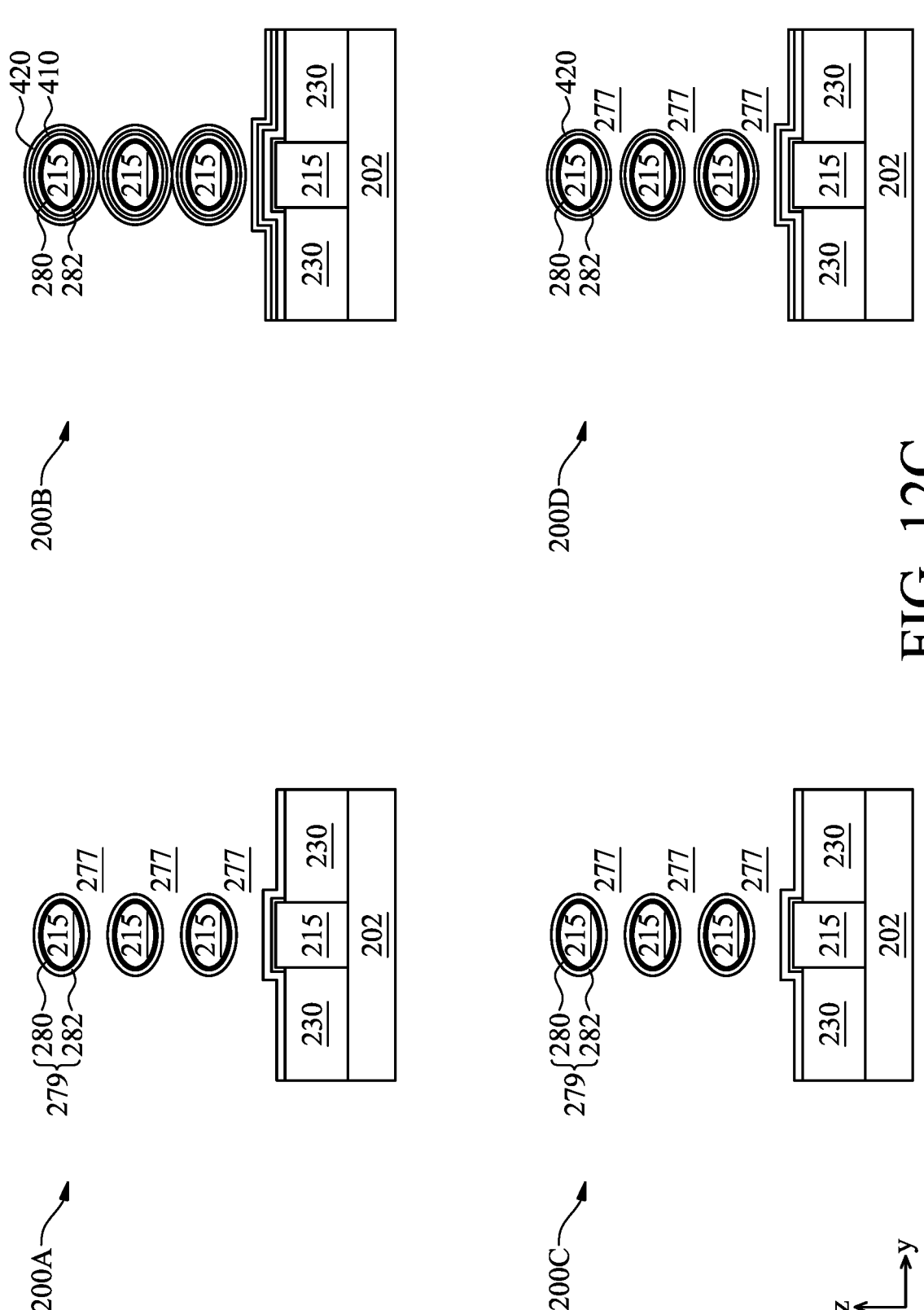
Figure 12D:
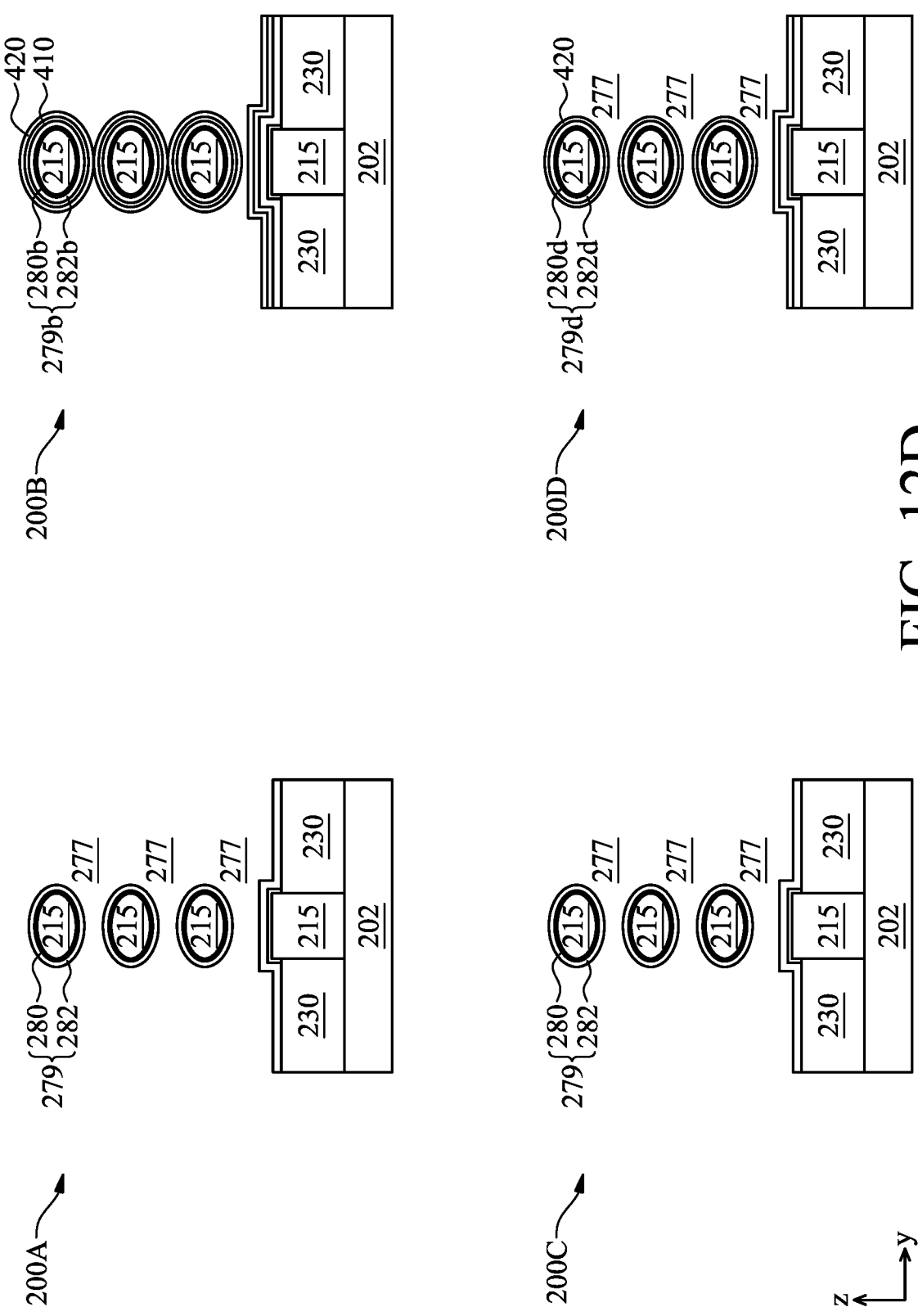
Figure 12E:
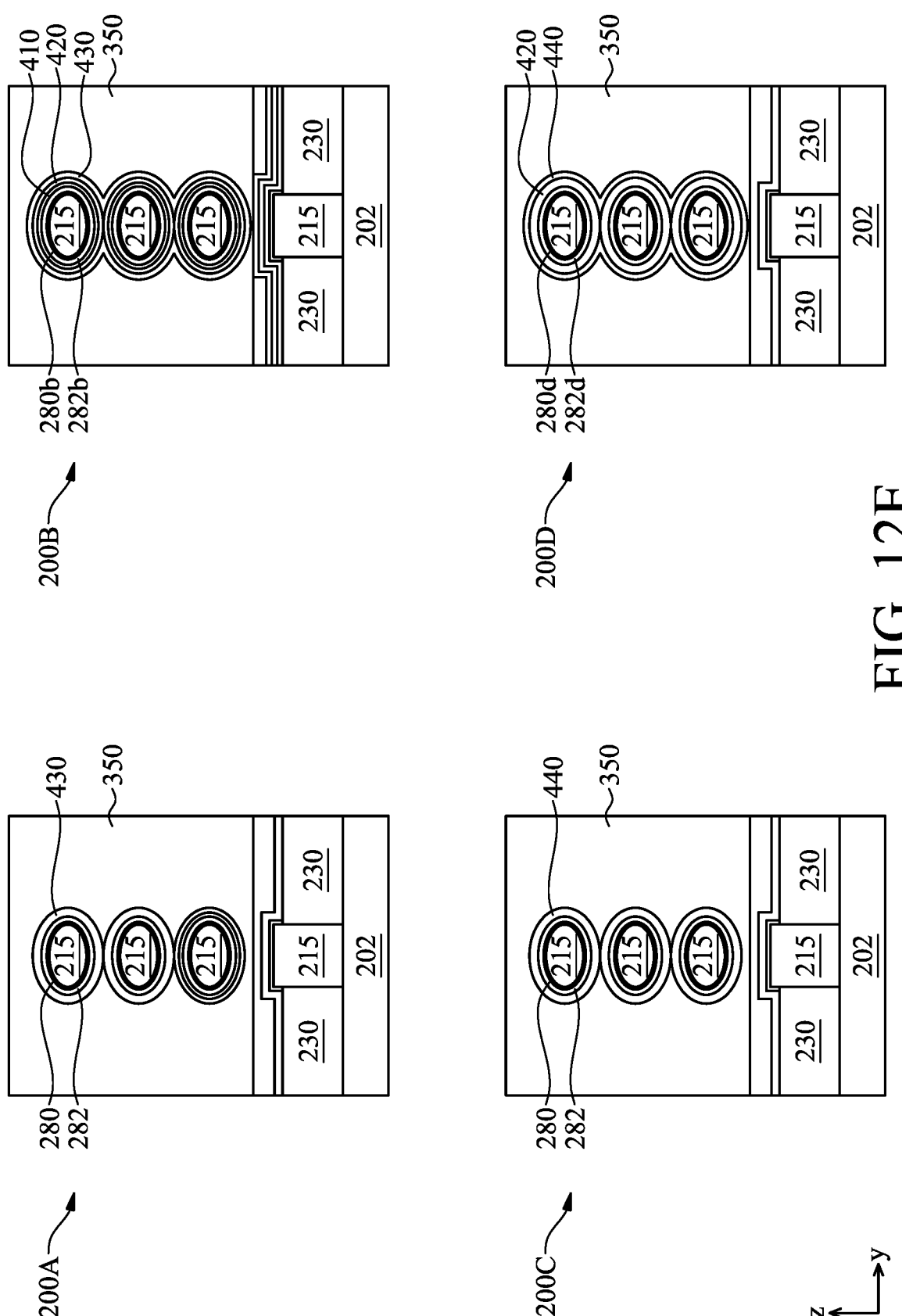

FIGS. 12A, 12B, 12C, 12D, and 12E illustrate cross-sectional views of the device 200A, 200B, 200C, or 200D along the A2-A2, B2-B2, C2-C2, and D2-D2 lines of FIG. 2A, respectively, in an alternative embodiment of the method 100. Referring to FIG. 12A, after the dipole layer 420 is deposited over the transistors 200A, 200B, 200C, and 200D, the operation 108 forms a mask 292 as shown in FIG. 12A. The mask 292 covers both the transistors 200B and 200D and exposes the transistors 200A and 200C. The material and formation process of the mask 292 are discussed above. Then, the operation 108 removes the dipole layer 420 from the transistors 200A and 200C, as shown in FIG. 12B. Subsequently, the operation 108 removes the mask 292, as shown in FIG. 12C. Now, the transistors 200A and 200C are free from the dipole patterns 410 and 420, the transistor 200D includes the dipole pattern 420 but not the dipole pattern 410, and the transistor 200B includes the dipole patterns 410 and 420. At operation 110, the method 100 performs an annealing process that drives the dipole elements from the dipole patterns 410 and 420 into the respective gate dielectric layers 279 (FIG. 12D). For the transistor 200B, since the dipole pattern 410 is in contact with the gate dielectric layer 279, it dominates the incorporation of the dipole elements. In other words, the gate dielectric layer 279b incorporates mostly the dipole elements from the dipole pattern 410. For the transistor 200D, the gate dielectric layer 279d incorporates the dipole elements from the dipole pattern 420. At operations 114, 116, and 118, the method 100 forms the work function metal layers 430 and 440 and the bulk metal layer 350 (FIG. 12E). Particularly, FIG. 12E illustrates an embodiment where the operation 112 is omitted and the dipole patterns 410 and 420 are kept in the transistors 200B and 200D.

FIGS. 13A and 13B illustrate two embodiments of the transistor 200B, in portion, along the B1-B1 line of FIG. 2A. The embodiment in FIG. 13A does not include the dipole pattern 410 and the embodiment in FIG. 13B includes the dipole pattern 410. Other aspects of the two embodiments are the same. As illustrated, the transistor 200B includes a corner transistor portion (or a corner transistor) Tr1 and a center transistor portion (or a center transistor) Tr2.

FIGS. 14A and 14B illustrate two embodiments of the transistor 200D, in portion, along the D1-D1 line of FIG. 2A. The embodiment in FIG. 14A does not include the dipole pattern 420 and the embodiment in FIG. 14B includes the dipole pattern 420. Other aspects of the two embodiments are the same. As illustrated, the transistor 200D includes a corner transistor portion (or a corner transistor) Tr3 and a center transistor portion (or a center transistor) Tr4.

The threshold voltages of the transistors Tr1 and Tr2 may be different depending on the amount of dipole elements incorporated therein. Consequently, the transistors Tr1 and Tr2 may turn on at slightly different times. Particularly, the corner transistor Tr1 generally incorporates a higher amount of dipole elements than the center transistor Tr2, per unit area. One reason is that the high-k dielectric layer 282 is thicker in the corner portion than in the center portion. For example, its diagonal dimension t1 is greater than its vertical dimension t2. Therefore, there are more dipole elements in the corner portion than in the center portion. Similarly, the threshold voltages and the turn-on time of the transistors Tr3 and Tr4 may be different depending on the amount of dipole elements incorporated therein. In approaches where n-type dipole elements are incorporated into p-type transistors or p-type dipole elements are incorporated into n-type transistors, the corner transistors Tr1 and Tr3 experience a higher threshold voltage and longer turn-on time than the center transistors Tr2 and Tr4 respectively, which adversely affects the device performance. In contrast, the present embodiment incorporates n-type dipole elements into n-type transistors and p-type dipole elements into p-type transistors. As a result, the corner transistors Tr1 and Tr3 experience a lower threshold voltage and shorter turn-on time than the center transistors Tr2 and Tr4 respectively, which improves the device performance.

Although not intended to be limiting, one or more embodiments of the present disclosure provide many benefits to a semiconductor device and the formation thereof. For example, embodiments of the present disclosure provide a process for incorporating dipole elements into gate dielectric layers of n-type and p-type transistors separately. The process not only provides multiple threshold voltages in the transistors, but also reduces the threshold voltages for each type of transistors. For example, it can provide an n-type transistor with a standard threshold voltage, another n-type transistor with a reduced threshold voltage, a p-type transistor with a standard threshold voltage, and another p-type transistor with a reduced threshold voltage. Also, the corner transistor portions in the transistors with reduced threshold voltage have even lower threshold voltage for better device performance. The present embodiments can be readily integrated into existing CMOS fabrication processes.

In one example aspect, the present disclosure is directed to a method that includes providing a structure having a substrate, first and second channel layers over the substrate, and first and second gate dielectric layers over the first and the second channel layers respectively. The method further includes forming a first dipole pattern over the first gate dielectric layer, the first dipole pattern having a first dipole material that is of a first conductivity type; forming a second dipole pattern over the second gate dielectric layer, the second dipole pattern having a second dipole material that is of a second conductivity type opposite to the first conductivity type; and annealing the structure such that elements of the first dipole pattern are driven into the first gate dielectric layer and elements of the second dipole pattern are driven into the second gate dielectric layer.

In some embodiments of the method, the forming of the first dipole pattern includes depositing a first dipole layer over both the first and the second gate dielectric layers, the first dipole layer having the first dipole material; forming an etch mask that covers the first dipole layer over the first gate dielectric layer and exposes the first dipole layer over the second gate dielectric layer; etching the first dipole layer through the etch mask; and removing the etch mask, wherein a portion of the first dipole layer remaining over the first gate dielectric layer becomes the first dipole pattern.

In some embodiments of the method, the forming of the second dipole pattern includes depositing a second dipole layer over both the first dipole pattern and the second gate dielectric layer, the second dipole layer having the second dipole material; forming an etch mask that covers the second dipole layer over the second gate dielectric layer; etching the second dipole layer through the etch mask; and removing the etch mask, wherein a first portion of the second dipole layer remaining over the second gate dielectric layer becomes the second dipole pattern. In a further embodiment, the etch mask exposes a second portion of the second dipole layer over the first dipole pattern, and the etching of the second dipole layer through the etch mask removes the second portion of the second dipole layer. In some further embodiments, the etch mask also covers a second portion of the second dipole layer over the first dipole pattern, and the second portion of the second dipole layer remains after the removing of the etch mask. In some further embodiments, the first conductivity type is n-type and the second conductivity type is p-type or the first conductivity type is p-type and the second conductivity type is n-type.

In some embodiments, the method further includes, after the annealing of the structure, forming a first work function metal layer over the first gate dielectric layer and a second work function metal layer over the second gate dielectric layer. In a further embodiment, after the annealing of the structure and before the forming of the first work function metal layer and the second work function metal layer, the method includes removing the first dipole pattern and the second dipole pattern from the structure.

In another example aspect, the present disclosure is directed to a method that includes providing a structure having a substrate, first and second channel layers over the substrate, and first and second gate dielectric layers over the first and the second channel layers respectively, the first and the second gate dielectric layers including a high-k dielectric material. The method further includes forming a first dipole pattern over the first gate dielectric layer, the first dipole pattern having an n-type dipole material; forming a second dipole pattern over the second gate dielectric layer, the second dipole pattern having a p-type dipole material; annealing the structure such that elements of the first dipole pattern are driven into the first gate dielectric layer and elements of the second dipole pattern are driven into the second gate dielectric layer; and forming an n-type work function metal layer over the first gate dielectric layer and a p-type work function metal layer over the second gate dielectric layer.

In an embodiment, the method further includes removing the first and the second dipole patterns after the annealing and before the forming of the n-type and the p-type work function metal layers.

In some embodiments, the n-type dipole material includes lanthanum, yttrium, or strontium. In some embodiments, the p-type dipole material includes aluminum, titanium, niobium, or scandium.

In some embodiments, the forming of the first dipole pattern is performed after the forming of the second dipole pattern and includes forming a layer of the n-type dipole material over the second dipole pattern. In a further embodiment, the layer of the n-type dipole material remains over the second dipole pattern during the annealing of the structure.

In some embodiments, the forming of the second dipole pattern is performed after the forming of the first dipole pattern and includes forming a layer of the p-type dipole material over the first dipole pattern. In a further embodiment, the layer of the p-type dipole material remains over the first dipole pattern during the annealing of the structure.

In yet another example aspect, the present disclosure is directed to a semiconductor device that includes a substrate; first and second n-type transistors over the substrate; and first and second p-type transistors over the substrate. The first n-type transistor includes a first channel layer, a first portion of a high-k dielectric layer over the first channel layer, a first portion of an n-type work function metal layer over the first portion of the high-k dielectric layer. The second n-type transistor includes a second channel layer, a second portion of the high-k dielectric layer over the second channel layer, a second portion of the n-type work function metal layer over the second portion of the high-k dielectric layer, wherein the second portion of the high-k dielectric layer includes a higher amount of an n-type dipole material than the first portion of the high-k dielectric layer. The first p-type transistor includes a third channel layer, a third portion of the high-k dielectric layer over the third channel layer, a first portion of a p-type work function metal layer over the third portion of the high-k dielectric layer. The second p-type transistor includes a fourth channel layer, a fourth portion of the high-k dielectric layer over the fourth channel layer, a second portion of the p-type work function metal layer over the fourth portion of the high-k dielectric layer, wherein the fourth portion of the high-k dielectric layer includes a higher amount of a p-type dipole material than the third portion of the high-k dielectric layer.

In an embodiment of the semiconductor device, the n-type dipole material includes one of lanthanum, yttrium, and strontium. In an embodiment of the semiconductor device, the p-type dipole material includes one of aluminum, titanium, niobium, and scandium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a substrate;

first and second n-type transistors over the substrate;

first and second p-type transistors over the substrate, wherein the first n-type transistor includes a first stack of channel layers and a first portion of a high-k dielectric layer surrounding channel layers of the first stack of channel layers, wherein the second n-type transistor includes a second stack of channel layers, a second portion of the high-k dielectric layer surrounding channel layers of the second stack of channel layers, and an n-type dipole layer over the second portion of the high-k dielectric layer, wherein the second portion of the high-k dielectric layer includes a higher amount of an n-type dipole material than the first portion of the high-k dielectric layer, wherein the first p-type transistor includes a third stack of channel layers and a third portion of the high-k dielectric layer surrounding channel layers of the third stack of channel layers, and wherein the second p-type transistor includes a fourth stack of channel layers, a fourth portion of the high-k dielectric layer surrounding channel layers of the fourth stack of channel layers, and a p-type dipole layer over the fourth portion of the high-k dielectric layer, wherein the fourth portion of the high-k dielectric layer includes a higher amount of a p-type dipole material than the third portion of the high-k dielectric layer; and a metal stack over and directly interfacing with the first portion of the high-k dielectric layer, the n-type dipole layer, the third portion of the high-k dielectric layer, and the p-type dipole layer.

2. The semiconductor device of claim 1, wherein the n-type dipole material includes one of lanthanum, yttrium, and strontium.

3. The semiconductor device of claim 1, wherein the p-type dipole material includes one of aluminum, titanium, niobium, and scandium.

4. The semiconductor device of claim 1, further comprising:

a first interfacial layer between the first stack of channel layers and the first portion of the high-k dielectric layer;

a second interfacial layer between the second stack of channel layers and the second portion of the high-k dielectric layer;

a third interfacial layer between the third stack of channel layers and the third portion of the high-k dielectric layer; and a fourth interfacial layer between the fourth stack of channel layers and the fourth portion of the high-k dielectric layer.

5. The semiconductor device of claim 4, wherein the second interfacial layer includes a higher amount of an n-type dipole material than the first interfacial layer, wherein the fourth interfacial layer includes a higher amount of a p-type dipole material than the third interfacial layer.

6. The semiconductor device of claim 1, wherein the metal stack includes:

an n-type work function metal layer over the first and the second portions of the high-k dielectric layer; and a p-type work function metal layer over the third and fourth portions of the high-k dielectric layer.

7. The semiconductor device of claim 6, wherein the n-type work function metal layer includes titanium, aluminum, carbon, or combinations thereof.

8. The semiconductor device of claim 6, wherein the p-type work function metal layer includes titanium nitride, tantalum nitride, tungsten nitride, ruthenium, or combinations thereof.

9. The semiconductor device of claim 6, wherein the n-type work function metal layer directly contacts the second portion of the high-k dielectric layer, and the p-type work function metal layer directly contacts the fourth portion of the high-k dielectric layer.

10. A semiconductor device, comprising:

a substrate;

first and second n-type transistors over the substrate; and first and second p-type transistors over the substrate, wherein the first n-type transistor includes a first stack of channel layers, a first portion of a high-k dielectric layer surrounding channel layers of the first stack of channel layers, and a first portion of an n-type work function metal layer over the first portion of the high-k dielectric layer, wherein the second n-type transistor includes a second stack of channel layers, a second portion of the high-k dielectric layer surrounding channel layers of the second stack of channel layers, and a second portion of the n-type work function metal layer over the second portion of the high-k dielectric layer, wherein the second portion of the high-k dielectric layer includes a higher amount of an n-type dipole material than the first portion of the high-k dielectric layer, wherein the first p-type transistor includes a third stack of channel layers, a third portion of the high-k dielectric layer surrounding channel layers of the third stack of channel layers, and a first portion of a p-type work function metal layer over the third portion of the high-k dielectric layer, and wherein the second p-type transistor includes a fourth stack of channel layers, a fourth portion of the high-k dielectric layer surrounding channel layers of the fourth stack of channel layers, and a second portion of the p-type work function metal layer over the fourth portion of the high-k dielectric layer, wherein the fourth portion of the high-k dielectric layer includes a higher amount of a p-type dipole material than the third portion of the high-k dielectric layer.

11. The semiconductor device of claim 10, wherein the n-type dipole material includes one of lanthanum, yttrium, and strontium, wherein the p-type dipole material includes one of aluminum, titanium, niobium, and scandium.

12. The semiconductor device of claim 10, further comprising:

a first dipole layer between the second portion of the n-type work function metal layer and the second portion of the high-k dielectric layer; and a second dipole layer between the second portion of the p-type work function metal layer and the fourth portion of the high-k dielectric layer, wherein the first portion of the n-type work function metal layer directly interfaces with the first portion of the high-k dielectric layer, the second portion of the n-type work function metal layer directly interfaces with the first dipole layer, the first portion of the p-type work function metal layer directly interfaces with the third portion of the high-k dielectric layer, and the second portion of the p-type work function metal layer directly interfaces with the second dipole layer.

13. The semiconductor device of claim 12, wherein the first dipole layer includes the n-type dipole material, and the second dipole layer includes the p-type dipole material.

14. The semiconductor device of claim 10, further comprising a bulk metal layer over the n-type and the p-type work function metal layers.

15. The semiconductor device of claim 14, wherein the bulk metal layer includes aluminum, tungsten, or copper.

16. The semiconductor device of claim 14, further comprising a blocking layer between the bulk metal layer and the n-type and the p-type work function metal layers.

17. A semiconductor device, comprising:
a substrate;
first and second n-type transistors over the substrate and having first and second channel layers, respectively, wherein the first channel layer is one layer of a first stacked channel of layers, and the second channel layer is one layer of a second stacked channel of layers;
first and second p-type transistors over the substrate and having third and fourth channel layers, respectively, wherein the third channel layer is one layer of a third stacked channel of layers, and the fourth channel layer is one layer of a fourth stacked channel of layers;
interfacial layers over and interfacing with the first, the second, the third, and the fourth channel layers, respectively;
a high-k dielectric layer over and interfacing with the interfacial layers;
an n-type work function metal layer over and interfacing with the high-k dielectric layer; and a p-type work function metal layer over and interfacing with the high-k dielectric layer,
wherein a first portion of the high-k dielectric layer includes a higher amount of a first n-type dipole material than a second portion of the high-k dielectric layer,
wherein a third portion of the high-k dielectric layer includes a higher amount of a first p-type dipole material than a fourth portion of the high-k dielectric layer.

18. The semiconductor device of claim 17, wherein the interfacial layers include:
a first interfacial layer between the first channel layer and the first portion of the high-k dielectric layer,
a second interfacial layer between the second channel layer and the second portion of the high-k dielectric layer
a third interfacial layer between the third channel layer and the third portion of the high-k dielectric layer; and
a fourth interfacial layer between the fourth channel layer and the fourth portion of the high-k dielectric layer.

19. The semiconductor device of claim 18,
wherein the first interfacial layer includes a higher amount of a second n-type dipole material than the second interfacial layer,
wherein the third interfacial layer includes a higher amount of a second p-type dipole material than the fourth interfacial layer.

20. The semiconductor device of claim 19,
wherein the first n-type dipole material is same as the second n-type dipole material,
wherein the first p-type dipole material is same as the second p-type dipole material.

*    *    *    *    *